(12) United States Patent
Ong et al.

(10) Patent No.: US 12,176,300 B2
(45) Date of Patent: Dec. 24, 2024

(54) MEMORY DEVICE INCLUDING SUPPORT STRUCTURES

(71) Applicant: Micron Technology, Inc., Boise, ID (US)

(72) Inventors: Andrew Zhe Wei Ong, Singapore (SG); Liu Ziyan, Singapore (SG); Soo Ting Helen Yee, Singapore (SG); Qitao Fu, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/209,231

(22) Filed: Jun. 13, 2023

(65) Prior Publication Data
US 2023/0326877 A1   Oct. 12, 2023

Related U.S. Application Data

(62) Division of application No. 17/111,117, filed on Dec. 3, 2020, now Pat. No. 11,705,403.

(51) Int. Cl.
| | |
|---|---|
| H01L 23/00 | (2006.01) |
| H01L 21/768 | (2006.01) |
| H01L 23/522 | (2006.01) |
| H01L 23/528 | (2006.01) |
| H10B 41/27 | (2023.01) |
| H10B 43/27 | (2023.01) |

(52) U.S. Cl.
CPC ...... *H01L 23/562* (2013.01); *H01L 21/76816* (2013.01); *H01L 21/76877* (2013.01); *H01L 23/5226* (2013.01); *H01L 23/5283* (2013.01); *H10B 41/27* (2023.02); *H10B 43/27* (2023.02)

(58) Field of Classification Search
None
See application file for complete search history.

(56) References Cited

U.S. PATENT DOCUMENTS

| | | | | |
|---|---|---|---|---|
| 2021/0159244 | A1* | 5/2021 | Xia | .......................... H10B 43/50 |
| 2021/0408025 | A1 | 12/2021 | Hinoue | |
| 2022/0102273 | A1* | 3/2022 | Kubo | ................ H01L 21/76816 |
| 2022/0181270 | A1 | 6/2022 | Ong et al. | |

FOREIGN PATENT DOCUMENTS

CN    114613409 A    6/2022

* cited by examiner

*Primary Examiner* — Hsien Ming Lee
(74) *Attorney, Agent, or Firm* — Schwegman Lundberg & Woessner, P.A.

(57) ABSTRACT

Some embodiments include apparatuses and methods of forming the apparatuses. One of the apparatuses includes tiers of respective memory cells and control gates, the tier located one over another over a substrate, the control gates including a control gate closest to the substrate, the control gates including respective portions forming a staircase structure; conductive contacts contacting the control gates at a location of the staircase structure, the conductive contacts including a conductive contact contacting the control gate; a dielectric structure located on sidewalls of the control gates; and support structures adjacent the conductive contacts and having lengths extending vertically from the substrate, the support structures including a support structure closest to the conductive contact, the support structure located at a distance from an edge of the dielectric structure, wherein a ratio of a width of the support structure over the distance is ranging from 1.6 to 2.0.

20 Claims, 16 Drawing Sheets

MEMORY DEVICE INCLUDING SUPPORT STRUCTURES

PRIORITY APPLICATION

This application is a divisional of U.S. application Ser. No. 17/111,117, filed Dec. 3, 2020, which is incorporated herein by reference in its entirety.

FIELD

Embodiments described herein relate to memory devices including support structures at staircase regions of the memory device.

BACKGROUND

Dimensions of structures of components in a memory device (e.g., a flash memory device) are relatively small (e.g., in nanometer size). At a certain dimension, collapse in some structures of the memory device may occur during fabrication of the memory device. Some conventional techniques use additional chemical process steps to prevent such collapse. However, the additional steps can increase cost of fabricating the memory device.

DETAILED DESCRIPTION

The techniques described herein involve a memory device having, among other structures, staircase structures and support structures located at the staircase structures. The support structures have specific dimensions (e.g., widths) and specific dimension relationships (e.g., ratios) with other structures. These specific dimensions and dimension relationships can prevent potential collapse of some structures of the memory device during the process of forming the memory device. The techniques described herein also involve a reticle that can be configured to be included in a system (e.g., lithography system) during part of the process of forming the support structures of the described memory device. The reticle is designed to include patterns, such that the support structures can have specific dimensions based on the dimensions of the patterns of the reticle. The dimensions of the patterns of the reticle are designed (e.g., determined) such that the support structures (which have dimensions based on the dimension of the patterns of the reticle) can prevent collapse of other structures of the memory device during the process of forming the memory device. Improvements and benefits of the techniques described herein are further discussed below with reference to FIG. 1 through FIG. 12.

Figure 1:
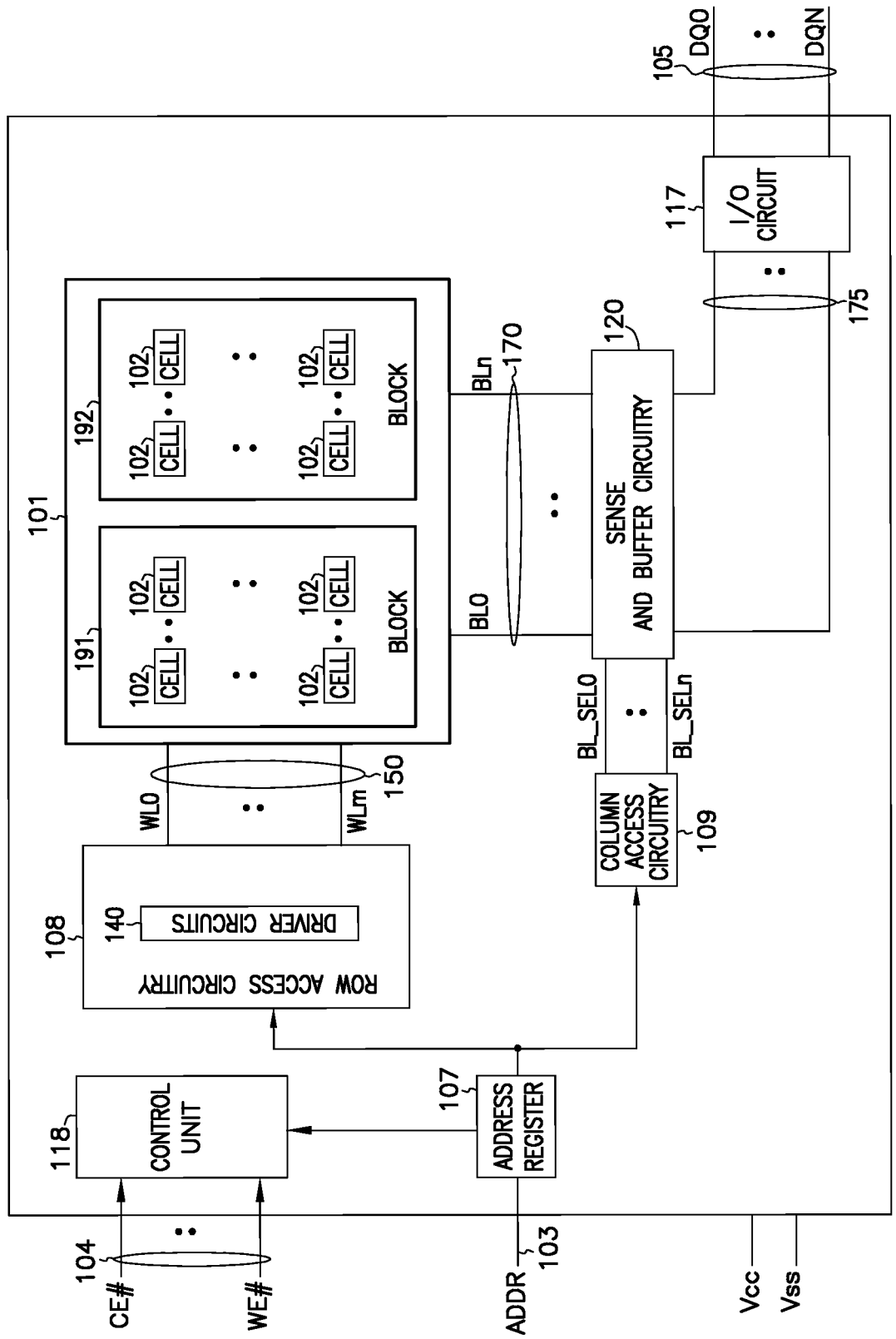
FIG. 1 shows an apparatus in the form of a memory device, according to some embodiments described herein.

FIG. 1 shows an apparatus in the form of a memory device 100, according to some embodiments described herein. Memory device 100 can include a memory array (or multiple memory arrays) 101 containing memory cells 102 arranged in blocks (blocks of memory cells), such as blocks 191 and 192. In the physical structure of memory device 100, memory cells 102 can be arranged vertically (e.g., stacked one over another) over a substrate (e.g., a semiconductor substrate) of memory device 100. FIG. 1 shows memory device 100 having two blocks 191 and 192 as an example. Memory device 100 can have more than two blocks.

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 of blocks 191 and 192 and data lines 170 to selectively exchange information (e.g., data) with memory cells 102.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which sub-blocks of blocks 191 and 192 are to be accessed during a memory operation. Memory device 100 can include drivers (driver circuits) 140, which can be part of row access circuitry 108. Drivers 140 can operate (e.g., operate as switches) to form (or not to form) conductive paths (e.g., current paths) between nodes providing voltages and respective access lines 150 during operations of memory device 100.

Memory device 100 can perform a read operation to read (e.g., sense) information (e.g., previously stored information) from memory cells 102 of blocks 191 and 192, or a write (e.g., programming) operation to store (e.g., program) information in memory cells 102 of blocks 191 and 192. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks 191 and 192.

Memory device 100 can include a control unit 118 that can be configured to control memory operations of memory device 100 based on control signals on lines 104. Examples of the control signals on lines 104 include one or more clock signals and other signals (e.g., a chip-enable signal CE #, a write-enable signal WE #) to indicate which operation (e.g., read, write, or erase operation) memory device 100 can perform. Other devices external to memory device 100 (e.g., a memory controller or a processor) may control the values of the control signals on lines 104. Specific values of a combination of the signals on lines 104 may produce a command (e.g., read, write, or erase command) that may cause memory device 100 to perform a corresponding memory operation (e.g., e.g., read, write, or erase operation).

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks 191 and 192 and provide the value of the information to lines (e.g., global data lines) 175. Sense and buffer circuitry 120 can also be configured to use signals on lines 175 to determine the value of information to be stored (e.g., programmed) in memory cells 102 of blocks 190 and 191 (e.g., during a write operation) based on the values (e.g., voltage values) of signals on lines 175 (e.g., during a write operation).

Memory device 100 can include input/output (I/O) circuitry 117 to exchange information between memory cells 102 of blocks 191 and 192 and lines (e.g., I/O lines) 105. Signals DQ0 through DQN on lines 105 can represent information read from or stored in memory cells 102 of blocks 191 and 192. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3-dimensional (3-D) NAND) or a NOR flash memory device, or another kind of memory device, such as a variable resistance memory device (e.g., a phase change memory device or a resistive Random Access Memory (RAM) device.

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 12.

Figure 2:
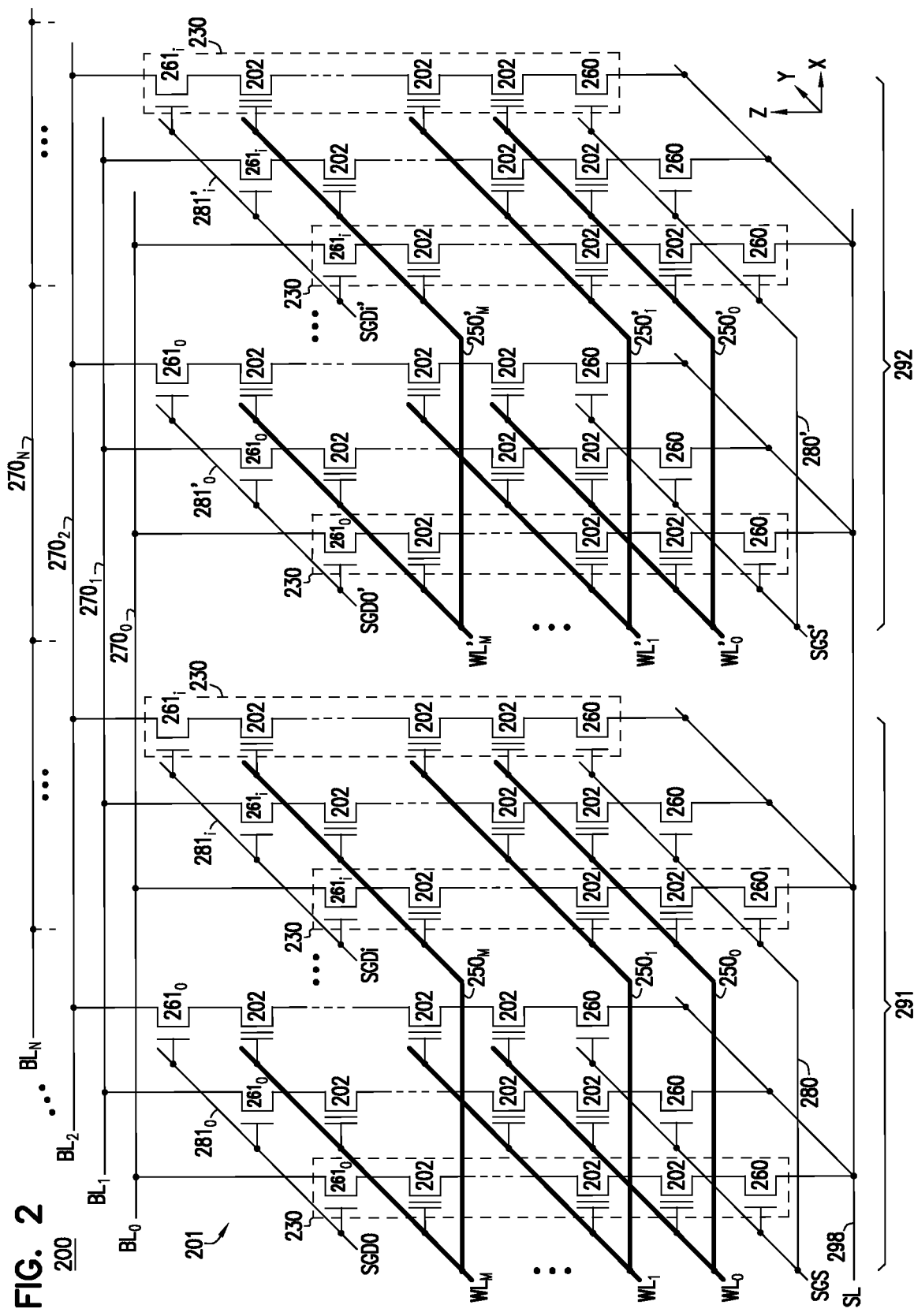
FIG. 2 shows a schematic of an apparatus in the form a memory device having a memory cell array and memory cell blocks, according to some embodiments described herein.

FIG. 2 shows a schematic of an apparatus in the form a memory device 200 having a memory cell array 201 and blocks (e.g., memory cell blocks) 291 and 292, according to some embodiments described herein. Memory device 200 can include a non-volatile (e.g., NAND flash memory device) or other types of memory devices. Memory device 200 can correspond to memory device 100. For example, memory array (or multiple memory arrays) 201 and blocks 291 and 292 can correspond to memory array 101 and blocks 191 and 192, respectively, of memory device 100 of FIG. 1.

As shown in FIG. 2, memory device 200 can include memory cells 202, data lines $270_0$ through $270_N$ ($270_0$-$270_N$), control gates $250_0$ through $250_M$ in block 291, and control gates $250'_0$ through $250'_M$ in block 292. Data lines $270_0$-$270_N$ can correspond to part of data lines 170 of memory device 100 of FIG. 1. In FIG. 2, label "N" (index N) next to a number (e.g., $270_N$) represents the number of data lines of memory device 200. For example, if memory device 200 includes 16 data lines, then N is 15 (data lines $270_0$ through $270_{15}$). In FIG. 2, label "M" (index N) next to a number (e.g., $250_M$) represents the number of control gates memory device 200. For example, if memory device 200 includes 128 control gates, then M is 127 (control gates $250_0$ through $250_{127}$). Memory device 200 can have the same number of control gates (e.g., M–1 control gates) among the blocks (e.g., blocks 291 and 292) of memory device 200.

In FIG. 2, data lines $270_0$-$270_N$ can include (or can be part of) bit lines (e.g., local bit lines) of memory device 200. As shown in FIG. 2, data lines $270_0$-$270_N$ can carry signals (e.g., bit line signals) $BL_0$ through $BL_N$, respectively. In the physical structure of memory device 200, data lines $270_0$-$270_N$ can be structured as conductive lines and have respective lengths extending in the Y-direction.

As shown in FIG. 2, memory cells 202 can be organized into separates blocks (blocks of memory cells) such as blocks 291 and 292. FIG. 2 shows memory device 200 including two blocks 291 and 292 as an example. However, memory device 200 can include numerous blocks. The blocks (e.g., blocks 291 and 292) of memory device 200 can share data lines (e.g., data lines $270_0$-$270_N$) to carry information (in the form of signals) read from or to be stored in memory cells of selected memory cells (e.g., selected memory cells in block 291 or 292) of memory device 200.

Control gates $250_0$-$250_M$ can be part of local word lines, which can be part of (or can be coupled to) access lines (e.g., global word lines) of memory device 200 that can correspond to access lines 150 of memory device 100 of FIG. 1. Control gates $250'_0$-$250'_M$ can be another part of other local word lines, which can be part of access lines (e.g., global word lines) of memory device 200. Control gates $250_0$-$250_M$ can be electrically separated from control gates $250'_0$-$250'_M$. Thus, blocks 291 and 292 can be accessed separately (e.g., accessed one at a time). For example, block 291 can be accessed at one time using control gates $250_0$-$250_M$, and block 292 can be accessed at another time using control gates $250'_0$-$250'_M$ at another time.

FIG. 2 shows directions X, Y, and Z that can be relative to the physical directions (e.g., dimensions) of the structure of memory device 200. For example, the Z-direction can be a direction perpendicular to (e.g., vertical direction with respect to) a substrate of memory device 200 (e.g., a substrate 499 shown in FIG. 4A). The Z-direction is perpendicular to the X-direction and Y-direction (e.g., the Z-direction is perpendicular to an X-Y plane of memory device 200). In the physical structure of memory device 200, control gates $250_0$-$250_M$ can be formed on different levels (e.g., layers) of memory device 200 in the Z-direction. In this example, the levels (e.g., layers) of control gates $250_0$-$250_M$ can be formed (e.g., stacked) one level (one layer of material) over another in the Z-direction.

As shown in FIG. 2, memory cells 202 can be included in respective memory cell strings 230 in each of the blocks (e.g., blocks 291 and 292) of memory device 200. Each of memory cell strings 230 can have series-connected memory cells (e.g., M+1 series-connected memory cells) in the Z-direction. In a physical structure of memory device 200, memory cells 202 in each of memory cell strings 230 can be formed (e.g., stacked vertically one over another) in different levels (e.g., M−1 different layers in the example of FIG. 2) in the Z-direction of memory device 200. The number of memory cell in each of strings 230 can be equal to the number of levels (e.g., layers) of control gates (e.g., control gates $250_0$-$250_M$) of memory device 200.

As shown in FIG. 2, control gates $250_0$-$250_M$ can carry corresponding signals $WL_0$-$WL_M$. As mentioned above, control gates $250_0$-$250_M$ can include (or can be parts of) access lines (e.g., word lines) of memory device 200. Each of control gates $250_0$-$250_M$ can be part of a structure (e.g., a level) of a conductive material (e.g., a layer of conductive material) located in a level of memory device 200. Memory device 200 can use signals $WL_0$-$WL_M$ to selectively control access to memory cells 202 of block 291 during an operation (e.g., read, write, or erase operation). For example, during a read operation, memory device 200 can use signals $WL_0$-$WL_M$ to control access to memory cells 202 of block 291 to read (e.g., sense) information (e.g., previously stored information) from memory cells 202 of block 291. In another example, during a write operation, memory device 200 can use signals $WL_0$-$WL_M$ to control access to memory cells 202 of block 291 to store information in memory cells 202 of block 291.

As shown in FIG. 2, control gates $250'_0$-$250'_M$ can carry corresponding signals $WL'_0$-$WL'_M$. Each of control gates $250'_0$-$250'_M$ can be part of a structure (e.g., a level) of a conductive material (e.g., a layer of conductive material) located in a single-level of memory device 200. Control gates $250'_0$-$250'_M$ can be located in the same levels (in the Z-direction) as control gates $250_0$-$250_M$, respectively. As mentioned above, control gates $250'_0$-$250'_M$ (e.g., local word lines) can be electrically separated from control gates $250_0$-$250_M$ (e.g., other local word lines)

Memory device 200 can use signals $WL'_0$-$WL'_M$ to control access to memory cells 202 respectively, of block 292 during an operation (e.g., read, write, or erase operation). For example, during a read operation, memory device 200 can use signals $WL'_0$-$WL'_M$ to control access to memory cells 202 of block 292 to read (e.g., sense) information (e.g., previously stored information) from memory cells 202 of block 292. In another example, during a write operation, memory device 200 can use signals $WL'_0$-$WL'_M$ to control access to memory cells 202 of block 292 to store information in memory cells 202 block 292.

As shown in FIG. 2, memory cells in different memory cell strings in the same a block can share (e.g., can be controlled by) the same control gate in that block. For example, in block 291, memory cells 202 coupled to control gate $250_0$ can share (can be controlled by) control gate $250_0$. In another example, memory cells 202 coupled to control gate $250_1$ can share (can be controlled by) control gate $250_1$. In another example, in block 292, memory cells 202 coupled to control gate $250'_0$ can share (can be controlled by) control gate $250'_0$. In another example, memory cells 202 coupled to control gate $250'_1$ can share (can be controlled by) control gate $250'_1$.

Memory device 200 can include a source (e.g., a source line, a source plate, or a source region) 298 that can carry a signal (e.g., a source line signal) SL. Source 298 can be structured as a conductive line or a conductive plate (e.g., conductive region) of memory device 200. Source 298 can be common source line (e.g., common source plate or common source region) of block 291 and 292. Source 298 can be coupled to a ground connection of memory device 200.

Memory device 200 can include select transistors (e.g., drain select transistors) $261_0$ through $261_i$ ($261_0$-$261_i$) and select gates (e.g., drain select gates) $281_0$ through $281_i$. Transistors $261_0$ can share the same select gate $281_0$. Transistors $261_i$ can share the same select gate $281_i$. Select gates $281_0$-$281_N$ can carry signals $SGD_0$ through $SGD_i$, respectively.

Transistors $261_0$-$261_1$ can be controlled (e.g., turned on or turned off) by signals $SGD_0$-$SGD_i$, respectively. During a memory operation (e.g., a read or write operation) of memory device 200, transistors $261_0$-$261_1$ can be turned on (e.g., by activating respective signals $SGD_0$-$SGD_i$) to couple memory cell strings 230 of block 291 to respective data lines $270_0$-$270_N$. Transistors $261_0$-$261_i$ can be turned off (e.g., by deactivating respective signals $SGD_0$-$SGD_i$) to decouple the memory cell strings 230 of block 291 from respective data lines $270_0$-$270_N$.

Memory device 200 can include transistors (e.g., source select transistors) 260, each of which can be coupled between source 298 and memory cells 202 in a respective memory cell string (one of memory cell strings 230) of block 291. Memory device 200 can include a select gate (e.g., source select gate) 280. Transistors 260 can share select gate 280. Transistors 260 can be controlled (e.g., turned on or turned off) by the same signal, such as SGS signal (e.g., source select gate signal) provided on select gate 280. During a memory operation (e.g., a read or write operation) of memory device 200, transistors 260 can be turned on (e.g., by activating an SGS signal) to couple the memory cell strings of block 291 to source 298. Transistors 260 can be turned off (e.g., by deactivating the SGS signal) to decouple the memory cell strings of block 291 from source 298.

Memory device 200 can include similar select gates and select transistors in block 292. For example, in block 292, memory device 200 can include select gates (e.g., drain select gates) $281'_0$ through $281'_i$, and transistors (e.g., drain select transistors) $261_0$-$261_i$. Transistors $261_0$ of block 291 can share the same select gate $281'_0$. Transistors $261_i$ of block 292 can share the same select gate $281'_i$. Select gates $281'_0$ through $281'_i$ can carry signals SGD0' through SGDi', respectively.

Transistors $261_0$-$261_i$ of block 292 can be controlled (e.g., turned on or turned off) by signals SGD0' through SGDi', respectively. During a memory operation (e.g., a read or write operation) of memory device 200, transistors $261_0$-$261_i$ of block 292 can be turned on (e.g., by activating respective signals SGD0' through SGDi') to couple the memory cell strings of block 292 to data lines $270_0$-$270_N$. Transistors $261_0$-$261_i$ of block 292 can be turned off (e.g., by deactivating respective signals SGD0' through SGDi') to decouple the memory cell strings of block 292 from respective sets of data lines $270_0$-$270_N$.

Memory device 200 can include transistors (e.g., source select transistors) 260, each of which can be coupled between source 298 and the memory cells in a respective memory cell string of block 292. Transistors 260 of block 292 can share the same select gate (e.g., source select gate) 280' of memory device 200. Transistors 260 of block 292 can be controlled (e.g., turned on or turned off) by the same signal, such as SGS' signal (e.g., source select gate signal) provided on select gate 280'. During a memory operation (e.g., a read or write operation) of memory device 200, transistors 260 of block 292 can be turned on (e.g., by activating an SGS' signal) to couple the memory cell strings of block 292 to source 298. Transistors 260 of block 292 can be turned off (e.g., by deactivating the SGS' signal) to decouple the memory cell strings of block 292 from source 298. FIG. 2 shows select gates 280 and 280' being electrically separated as an example. Alternatively, select gates 280 and 280' can be electrically coupled to each other.

Memory device 200 includes other components, which are not shown in FIG. 2 so as not to obscure the example embodiments described herein. Some of the structures of memory device 200 are described below with reference to FIG. 2 through FIG. 12. For simplicity, detailed description of the same element among the drawings (FIG. 1hh through FIG. 12) is not repeated.

Figure 3:
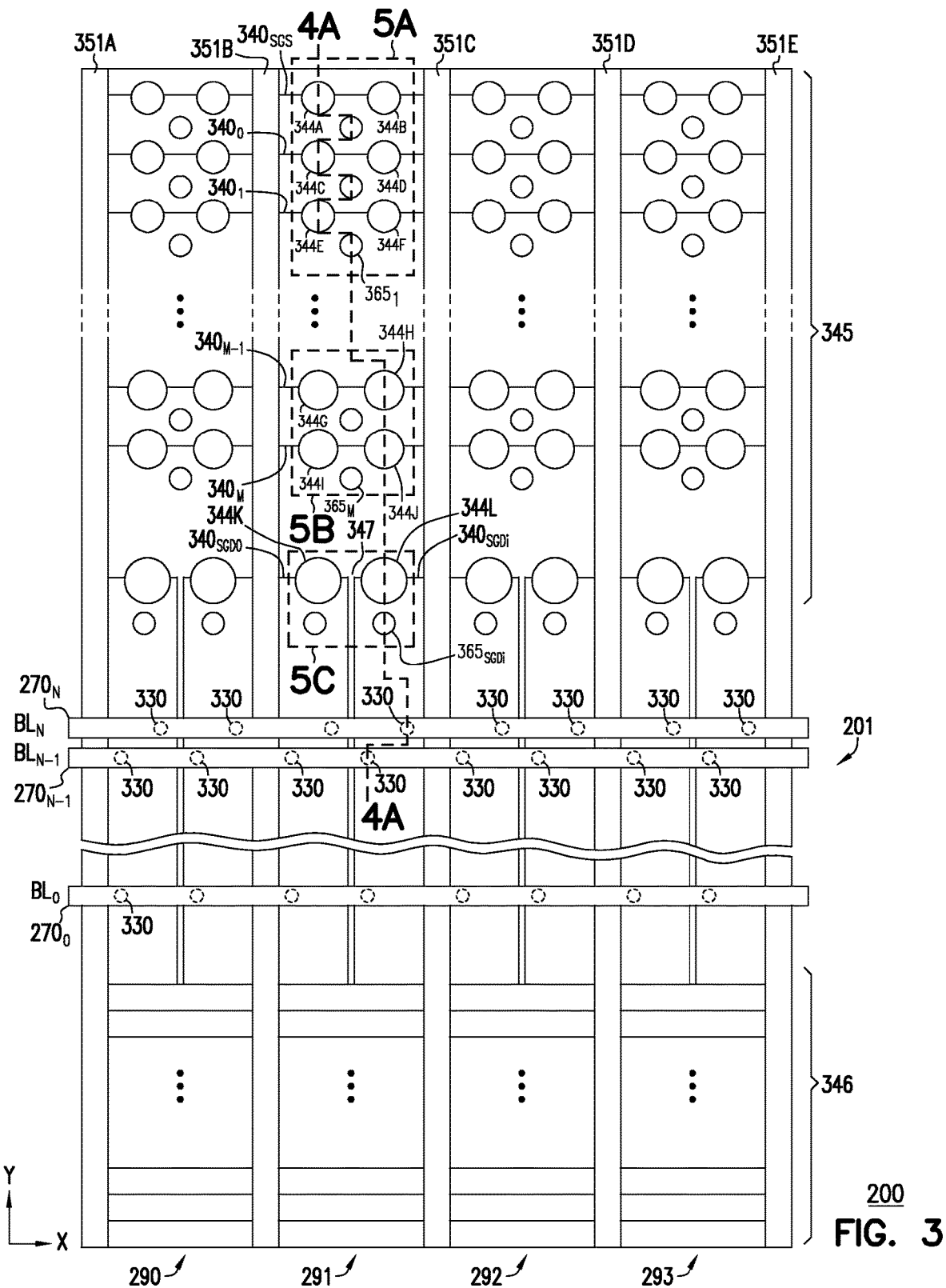
FIG. 3 shows a top view of a structure of the memory device of FIG. 2 including the memory cell array, staircase regions, and dielectric structures between the memory cell blocks, according to some embodiments described herein.

FIG. 3 shows a top view of a structure of memory device 200 including a memory cell array 201, staircase regions 345 and 346, dielectric structures 351A, 351B, 351C, 351D, and 351E between blocks 290, 291, 292, and 293, according to some embodiments described herein. In the figures (drawings) herein, similar or the same elements of memory device 200 of FIG. 2 and other figures (e.g., FIG. 3 through FIG. 12) are given the same labels. Their detailed description and functions are repeated from one figure to another figure. For simplicity, cross-sectional lines (e.g., hatch lines) are omitted from some or all the elements shown in the drawings described herein. Some elements of memory device 200 may be omitted from a particular figure of the drawings so as not to obscure the view or the description of the element (or elements) being described in that particular figure. Further, the dimensions (e.g., physical structures) of the elements shown in the drawings described herein are not scaled.

As shown in FIG. 3, blocks (blocks of memory cells) 290, 291, 292, and 293 (290-293) of memory device 200 can be located side-by-side in the X-direction. Four blocks 290-293 are shown as an example. Memory device 200 can include numerous blocks. Blocks 291 and 292 of FIG. 3 are schematically shown and described above with reference to FIG. 2. Other blocks (e.g., block 290 and 293) of memory device 200 are not shown in FIG. 2.

Dielectric structures 351A, 351B, 351C, 351D, and 351E of memory device can have lengths extending in the Y-direction between blocks 290-293. Each dielectric structures 351A, 351B, 351C, 351D, and 351E can include a slit (e.g., a trench having a depth in the Z-direction) and dielectric material (or materials) formed (e.g., filled) in the slit. Dielectric structures 351A, 351B, 351C, 351D, and 351E can electrically separate one block from another. For example, dielectric structure 351B can electrically separate block 291 from block 290, and dielectric structure 351C can electrically separate block 291 from block 292. Control gates and select gates of adjacent blocks can be electrically separated from each other by a dielectric structure between the adjacent blocks. For example, control gates $250_0$ through $250_M$ and select gates 280 and $281_0$ through $281_i$ (FIG. 2) can be electrically separated from control gates $250'_0$ through $250'_M$ and select gates 280' and $281'_0$ through $281'_i$ (FIG. 2) by dielectric structure 351C.

Memory device 200 can include pillars 330 in blocks 290, 291, 292, and 293 coupled to respective data lines data lines $270_0$ through $270_N$. Memory cells 202 of a memory cell string can be located (e.g., can be formed vertically) long the length (shown in FIG. 4A) of a corresponding pillar 330.

As shown in FIG. 3, data lines $270_0$ through $270_N$ (associated with signals $BL_0$ through $BL_N$) of memory device 200 can be located over memory cell array 201 and can have length extend in the X-direction. Data lines $270_0$ through $270_N$ can extend over (e.g., on top of) and across (in the X-direction) blocks 290-293 and can be shared by blocks 290-293. Data lines $270_0$ through $270_N$ can be coupled to respective pillars 330 (which are located under data lines $270_0$ through $270_N$ in the Z-direction).

Staircase regions 345 and 346 of memory device 200 can be located on respective sides (in the Y-direction) of memory cell array 201. Staircase regions 345 and 346 can include conductive contacts to provide electrical connections (e.g., signals) to select gates and control gates (e.g., select gates 280, $281_0$ and $281_i$ and control gates $250_0$ through $250_M$ of FIG. 2) in respective blocks 290, 291, 292, and 293 of memory device 200. Staircase regions 345 and 346 can include similar structures. However, details of staircase region 346 are omitted from FIG. 3 for simplicity and from the description herein. In an alternative embodiment (e.g., alterative structure) of memory device 200, staircase region 346 can be omitted from memory device 200, such that only staircase region 345 (and not both staircase regions 345 and 346) is included in memory device 200.

As shown in FIG. 3, in block 291, memory device 200 can include support structures 344A through 344L and conductive contacts (only conductive contacts $365_1$, $365_M$, and $365_{SGDi}$ are labeled) in respective portions 5A, 5B, and 5C of memory device 200. For simplicity, FIG. 3 does not give labels for other support structures and other conductive contacts of blocks 290-293. Portions 5A, 5B, and 5C of memory device 200 of FIG. 3 are shown in more details in FIGS. 5A, 5B, and 5C, respectively. In FIG. 3, line 4A-4A shows a location of a portion (e.g., a cross-section) of memory device 200 shown in FIG. 4A.

As shown in FIG. 3, memory device 200 can include conductive materials $340_{SGS}$, $340_0$, $340_1$, $340_{M-1}$, $340_M$, $340_{SGD0}$, and $340_{SGDi}$ in block 291 that can form (form the materials of) select gate 280, control gates $250_0$ through $250_M$, and select gates $280_0$ and $280_i$, respectively, of FIG. 2. Conductive materials $340_{SGD0}$ and $340_{SGDi}$ can be electrically separated from each by a gap 347 (which can be filled with a dielectric material (or materials). For simplicity, FIG. 3 does not give labels for other conductive materials that form select gates and control gates of block 290, 292, and 291.

Figure 4A:
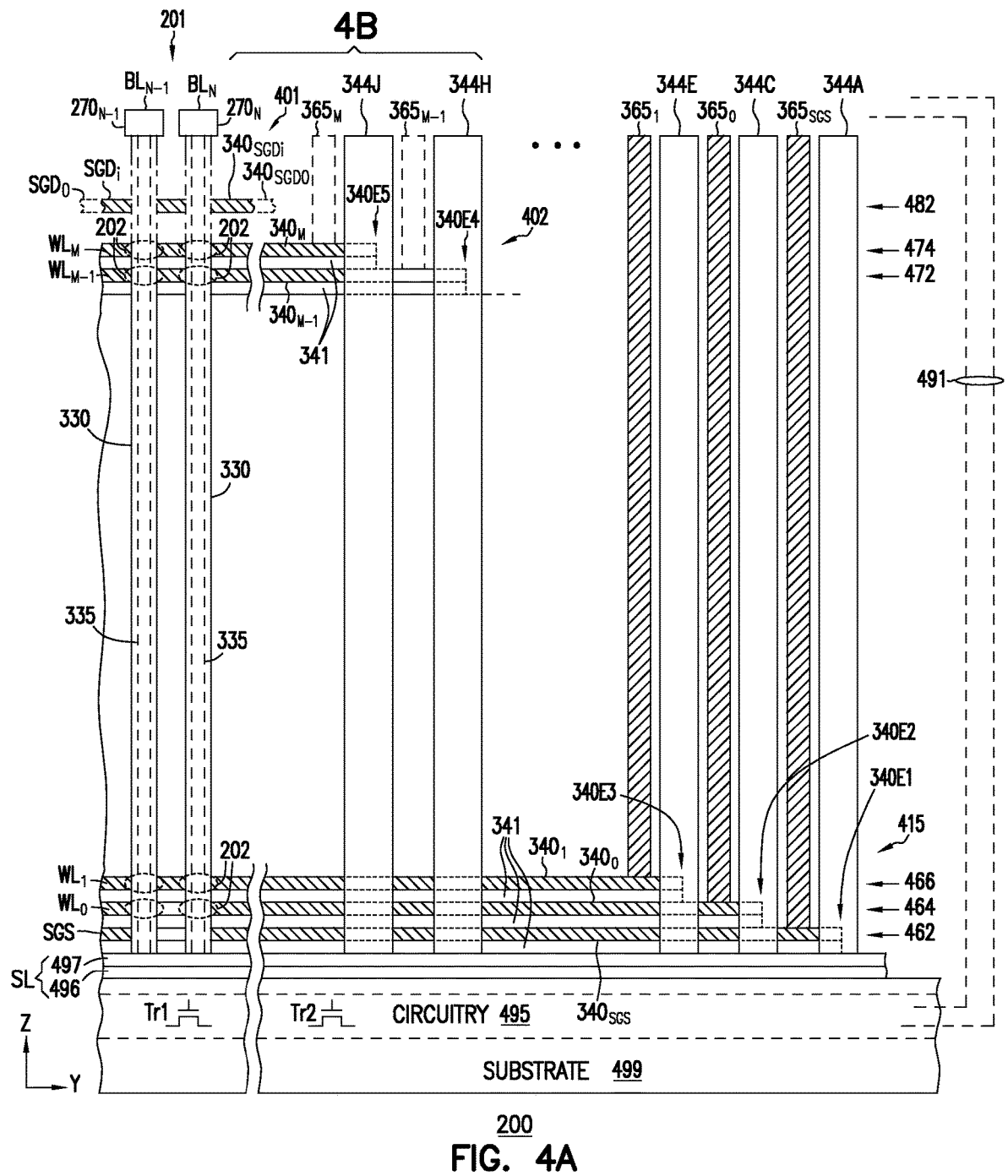
FIG. 4A shows of a portion (e.g., a cross-section) of the memory device of FIG. 3.

FIG. 4A shows of a portion (e.g., a cross-section) of memory device 200 shown along line 4A-4A of FIG. 3. As shown in FIG. 4A, memory device 200 can include levels 462, 463, 464, 472, 474, and 482 that can be physical layers (e.g., portions) in the Z-direction of memory device 200. Conductive materials $340_{SGS}$, $340_0$, $340_1$, $340_{M-1}$, $340_M$, $340_{SGD0}$, and $340_{SGDi}$ can be located (e.g., stacked) one level (e.g., one layer) over another in levels 462, 463, 464, 472, 474, and 482 in the Z-direction. Conductive materials $340_{SGD0}$ and $340_{SGDi}$ can be located on the same level (e.g., level 482). Conductive materials $340_{SGS}$, $340_0$, $340_1$, $340_{M-1}$, $340_M$, and $340_{SGDi}$ can be called levels of conductive materials $340_{SGS}$, $340_0$, $340_1$, $340_{M-1}$, $340_M$, and $340_{SGDi}$.

As shown in FIG. 4A, conductive materials $340_{SGS}$, $340_0$, $340_1$, $340_{M-1}$, $340_M$, and $340_{SGDi}$ can interleave with dielectric materials 341 in the Z-direction. Conductive materials $340_{SGS}$, $340_0$, $340_1$, $340_{M-1}$, $340_M$, and $340_{SGDi}$ can include metal (e.g., tungsten, or other metal), other conductive materials, or a combination of conductive materials. Dielectric materials 341 can include silicon dioxide.

Signals SGS, $WL_0$, $WL_1$, $WL_{M-1}$, $WL_M$, $SGD_0$, and $SGD_i$ in FIG. 4A associated with respective conductive materials in FIG. 4A are the same as the signals shown in FIG. 2. Conductive material $340_{SGS}$ can form select gate 280 (associated with signal SGS) of FIG. 2. Conductive materials $340_0$, $340_1$, $340_{M-1}$, and $340_M$ can form control gates $250_0$ through $250_M$ (associated with signals $WL_0$, $WL_1$, $WL_{M-1}$, and $WL_M$, respectively) of FIG. 2. Conductive material $340_{SDG0}$ and $340_{SGDi}$ (associated with signals $SGD_0$, and $SGD_i$) can form select gates $280_0$ and $280_i$, respectively, of FIG. 2.

As shown in FIG. 4A, conductive materials $340_0$ (which forms control gate $250_0$ associated with signal $WL_0$) can be closest (in the Z-direction) to the substrate 499 relative to other conductive materials $340_1$, $340_{M-1}$, and $340_M$ that form other control gates $250_1$ through $250_M$ (associated with signals $WL_{M-1}$, and $WL_M$) of memory device 200.

FIG. 4A shows an example of memory device 200 including one level of conductive material materials $340_{SGS}$ that forms a select gate (e.g., source select gate associated with signal SGS). However, memory device 200 can include multiple levels of conductive materials (e.g., multiple levels of conductive material $340_{SGS}$) located under (in the Z-direction) the level of conductive materials $340_1$ (e.g., below level 464) to form multiple source select gates of memory device 200.

FIG. 4A shows an example of memory device 200 including one level of conductive material materials $340_{SGD0}$ that forms a select gate (e.g., drain select gate associated with signal $SGD_0$) and one level of conductive material materials $340_{SGDi}$ that forms a select gate (e.g., drain select gate associated with signal $SGD_i$). However, memory device 200 can include multiple levels of conductive materials (e.g., multiple levels of conductive material $340_{SGD0}$) over (in the Z-direction) the level of conductive materials $340_M$ (e.g., over level 474) to form multiple drain select gates similar to the select gate associated with signal $SGD_0$ of memory device 200. Similarly, memory device 200 can include multiple levels of conductive materials (e.g., multiple levels of conductive material $340_{SGDi}$) over (in the Z-direction) the level of conductive materials $340_M$ (e.g., over level 474) to form multiple drain select gates similar to the select gate associated with signal $SGD_i$ of memory device 200.

As shown in FIG. 4A, memory device 200 can include staircase structures 415, 402, and 401 located in staircase region 345 (FIG. 3). Respective portions (e.g., end portions) of conductive materials $340_{SGS}$, $340_0$, and $340_1$ and their respective edges (e.g., steps) at locations 340E1, 304E2, and 340E3 can collectively form staircase structure 415. Respective portions (e.g., end portions) of conductive materials $340_{M-1}$ and $340_M$ and their respective edges (e.g., steps) at locations 340E4 and 304E5 can collectively form staircase structure 402. A portion (e.g., end portion) of conductive materials $340_{SDG1}$ and its edge (e.g., step) at location 340E6 (shown in FIG. 4B) can form staircase structure 401. The description herein gives an example number of edges (e.g., edges at locations 340E1 through 340E6) included in a particular staircase structure. However, each staircase structure can include more than one edge and can include a number of edges different from those shown in FIG. 4A.

For simplicity, FIG. 4A omits other staircase structures between staircase structures 402 and 415. Memory device 200 can include up to 15 staircase structures. Alternatively, memory device 200 can include more than 15 staircase structures.

As shown in FIG. 4A, staircase structure 415 can be located closest (in the Z-direction) to substrate 499 relative to locations (in the Z-direction) of other staircase structures among the staircase structures (e.g., staircase structures 401 and 402, and staircase structures (not shown) between staircase structures 402 and 415.

In FIG. 4A, a level of conductive material (e.g., conductive material $340_1$) and an adjacent level of dielectric material 341 (e.g., dielectric material 341 between conductive materials $340_0$ and $340_1$) can be called a tier of memory device 200. As shown in FIG. 4A, the tiers can be located (e.g., stacked) one over another in the Z-direction over substrate 499. FIG. 4A shows an example of specific number of tiers (and corresponding edges) and corresponding number of tiers for each staircase structure (e.g., three tiers for staircase structure 415). However, each staircase structure of memory device 200 can be formed from a number of tiers (and corresponding edges) that is different from the number of tiers shown in FIG. 4A. FIG. 4A shows a few tiers of memory device 200 for simplicity. However, memory device 200 can include up to one hundred tiers. Alternatively, memory device 200 can include more than one hundred tiers.

Other blocks (e.g., blocks 290, 292, and 293) of memory device 200 of FIG. 3 can also have their own staircase structures similar to that of block 291. For simplicity, details of staircase structures of the other blocks (e.g., blocks 290, 292, and 293) of memory device 200 are omitted from the description herein.

As shown in FIG. 4A, dielectric materials 341 can also include edges (not labeled) adjacent (e.g., aligned in the Z-direction with) respective edges 340E1 through 340E5. Thus, staircase structures 401, 402, and 415 can also be formed in part by portions and edges of dielectric materials 341.

Figure 4B:
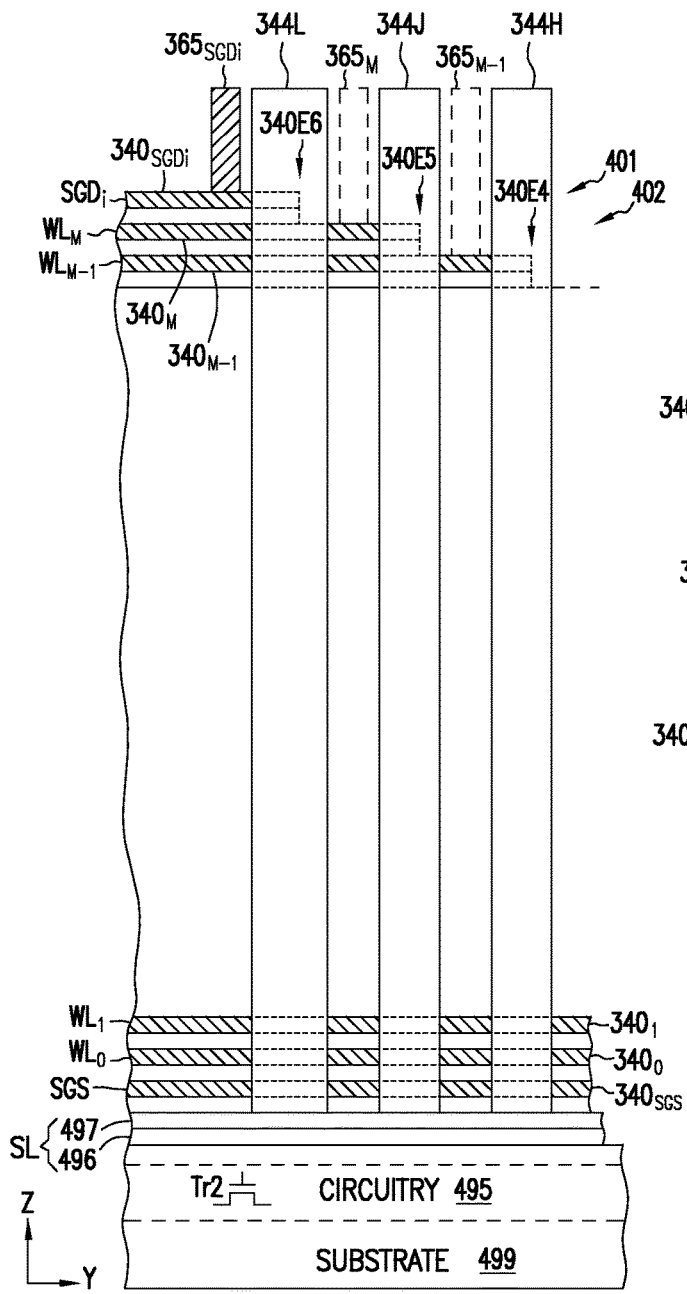
FIG. 4B shows more details of a portion of the memory device of FIG. 4A.
Figure 4C:
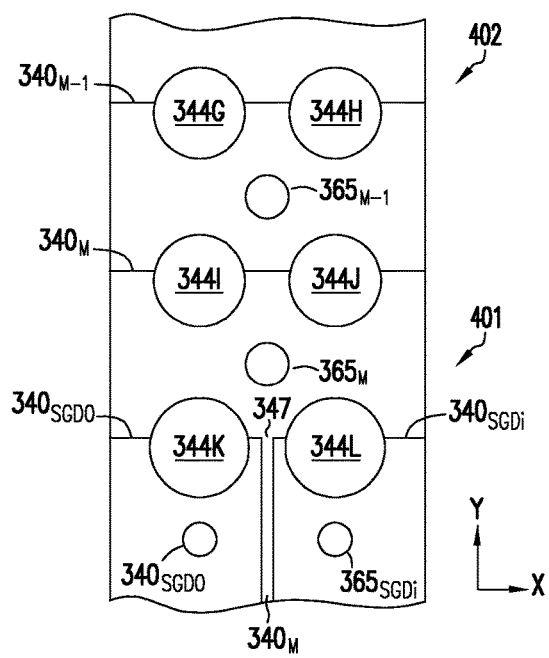
FIG. 4C shows a top view of a portion of memory device 200 of FIG. 4B.

The following description refers to FIG. 4A, FIG. 4B, and FIG. 4C. FIG. 4B shows more details of a portion of memory device 200 of FIG. 4A. FIG. 4C shows a top view of a portion of memory device 200 of FIG. 4B.

As shown in FIG. 4A and FIG. 4C, conductive materials $340_{SGD0}$ and $340_{SGDi}$ can be located on the same level (e.g., level 482 in FIG. 4A) and located side-by-side (in the X-direction, in FIG. 4C). As shown in FIG. 4C, conductive materials $340_{SGD0}$ and $340_{SGDi}$ (which form select gates $281_0$ and $281_i$, respectively) can be electrically separated from each other by gap 347.

As shown in FIG. 4A and FIG. 4B, memory device 200 can include a substrate 499 and materials 496 and 497 located over (e.g., formed over) substrate 499. Substrate 499 can include semiconductor (e.g., silicon) substrate. Substrate 499 can also include circuitry 495 located under other components of memory device 200 that are formed over substrate 499. Circuitry 495 can include circuit elements (e.g., transistors Tr1 and Tr2 shown in FIG. 4A) coupled to circuit elements outside substrate 499. For example, the circuit elements outside substrate 499 can include data lines $270_0$ through $270_N$, conductive contacts $365_{SGS}$, $365_1$, $365_M$, $365_{M-1}$ (FIG. 4A), $365_{SGDi}$ (FIG. 4B), and $365_{SGD0}$ (FIG. 4C), and part of conductive paths 491 and other (not shown) conductive connections, and other circuit elements of memory device 200. The circuit elements (e.g., transistors Tr1 and Tr2) of circuitry 495 can be configured to perform part of a function of memory device 200. For example, transistors Tr1 and Tr2 can be part of decoder circuits, driver circuits, buffers, sense amplifiers, charge pumps, and other circuitry of memory device 200.

As shown in FIG. 4A, conductive paths (e.g., conductive routings) 491 can include portions (segments) extending in the Z-direction (e.g., extending vertically). Conductive paths 491 can include (e.g., can be coupled to) some (or all) of the conductive contacts of memory device 200 (e.g., conductive contacts $365_{SGS}$, $365_0$, $365_1$, $365_M$, $365_{M-1}$ (FIG. 4A), $365_{SGDi}$ (FIG. 4B), and $365_{SGD0}$ (FIG. 4C). As shown in FIG. 4A, conductive paths 491 can be coupled to circuitry 495. For example, at least one of conductive paths 491 can be coupled to at least of one transistors Tr1 and Tr2 of circuitry 495.

Conductive paths 491 can provide electrical connections between of conductive contacts $365_{SGS}$, $365_0$, $365_1$, $365_M$, $365_{M-1}$ (FIG. 4A), $365_{SGDi}$ (FIG. 4B), and $365_{SGD0}$ (FIG. 4C) and other elements of memory device 200. For example, conductive paths 491 can be coupled to conductive contacts $365_{SGS}$, $365_0$, $365_1$, $365_M$, $365_{M-1}$ (FIG. 4A), $365_{SGDi}$ (FIG. 4B), and $365_{SGD0}$ (FIG. 4C) and circuit elements (e.g., word line drivers and word line decoders, not shown) of circuitry 495 to provide electrical connection (e.g., in the form of signals SGS, $WL_0$, $WL_1$, $WL_{M-1}$, $WL_M$, $SGD_0$, and $SGD_i$) from circuit elements (e.g., word line drivers, word line decoders, and charge pumps, not shown) in circuitry 495 to conductive contacts $365_{SGS}$, $365_0$, $365_1$, $365_M$, $365_{M-1}$, $365_{SGDi}$, and $365_{SGD0}$, respectively.

As shown in FIG. 4A and FIG. 4B, conductive contacts $365_{SGS}$, $365_0$, $365_1$, $365_M$, $365_{M-1}$, and $365_{SGDi}$ (conductive contacts $365_{SGD0}$ is hidden from the view of FIG. 4A and FIG. 4B) can have different lengths extending in the Z-direction (e.g., extending vertically (e.g., outward) from substrate 499). Each of each conductive contacts $365_{SGS}$, $365_0$, $365_1$, $365_M$, $365_{M-1}$, $365_{SGD0}$, and $365_{SGDi}$ can contact (e.g., land on) a respective level of conductive material among conductive materials $340_{SGS}$, $340_0$, $340_1$, $340_{M-1}$, $340_M$, $340_{SGD0}$, and $340_{SGDi}$ to form an electrical contact with the respective level of conductive material. Thus, conductive contacts $365_{SGS}$, $365_0$, $365_1$, $365_M$, $365_{M-1}$, $365_{SGD0}$, and $365_{SGDi}$ can be part of conductive paths (e.g., part of conductive paths 491) to carry electrical signals to the select gate (e.g., source select gate associated with signal SGS), the control gates (e.g., control gates associated with signals $WL_M$ and $WL_{M-1}$) and other select gates (e.g., drain select gates associated with signals $SGD_0$ and $SGD_i$), respectively.

As shown in FIG. 4A, conductive contact $365_{SGS}$ is electrically in contact with conductive materials $340_{SGS}$ and electrically separated from the rest of conductive materials (e.g., conductive materials $340_0$, $340_1$, $340_{M-1}$, $340_M$, and $340_{SGDi}$). Conductive contact $365_0$ is electrically in contact with conductive materials $340_0$ and electrically separated from the rest of conductive materials (e.g., conductive materials $340_{SGS}$, $340_1$, $340_{M-1}$, $340_M$, and $340_{SGDi}$). Thus, a conductive contact (e.g., conductive contact $365_0$) can be electrically in contact with only one of the conductive materials among the conductive materials (e.g., conductive materials $340_{SGS}$, $340_0$, $340_1$, $340_{M-1}$, $340_M$, and $340_{SGDi}$) of memory device 200.

Materials 496 and 497 (FIG. 4A and FIG. 4B) be part of source (e.g., a source line, a source plate, or a source region) 298 (FIG. 2) of memory device 200. Material 496 can include polysilicon. Material 497 can tungsten oxide.

Support structures 344A through 344L can be formed to provide structural support to a portion (e.g., staircase region 345) of memory device 200 during particular processes of forming memory device 200, as described in more detail with reference to FIG. 8A through FIG. 10C).

As shown in FIG. 4A, support structures 344A, 344C, 344E, 344H, and 344J can have the same length extending in the Z-direction (e.g., extending vertically (e.g., outward) from substrate 499). Support structures 344B, 344D, 344F, 344G, 344I, and 344K (hidden from the views of FIG. 4A and FIG. 4B) can also have the same lengths as support structures 344A, 344C, 344E, 344H, and 344J shown in FIG. 4A. Support structures 344A through 344L can go through a respective portion of conductive materials $340_{SGS}$, $340_0$, $340_1$, $340_{M-1}$, $340_M$, and $340_{SGDi}$ and dielectric materials 341. Support structures 344A through 344L are electrically separated from conductive materials $340_{SGS}$, $340_0$, $340_1$, $340_{M-1}$, $340_M$, $340_{SGD0}$, and $340_{SGDi}$. Each of support structures 344A through 344L can contact (e.g., lands on) on material 497.

Figure 5A:
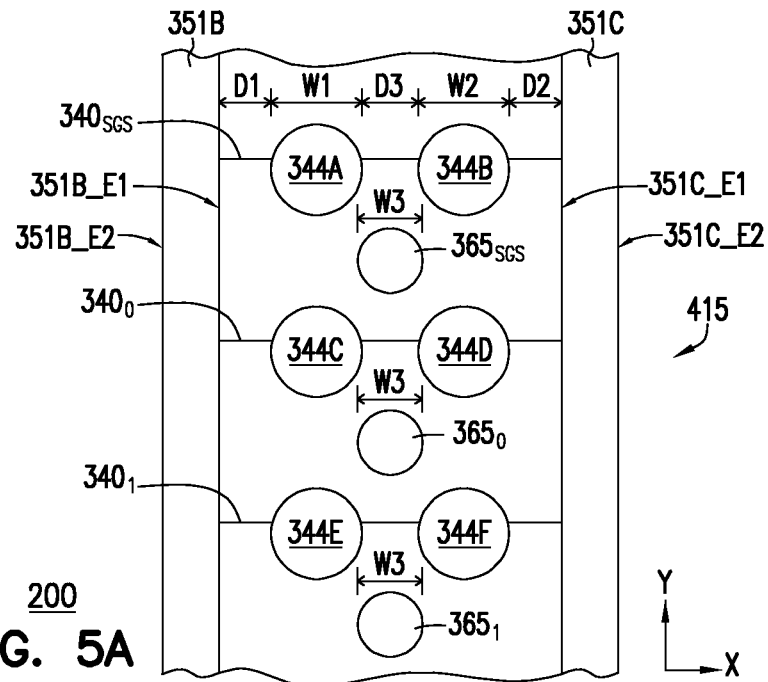
FIG. 5A, FIG. 5B, and FIG. 5C are representative diagrams showing top views of different portions of the memory device of FIG. 3, according to some embodiments described herein.
Figure 5B:
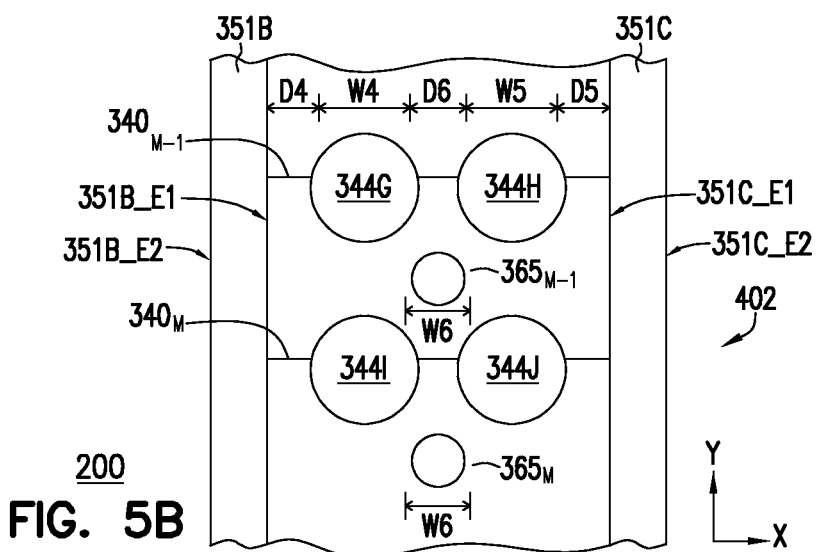
Figure 5C:
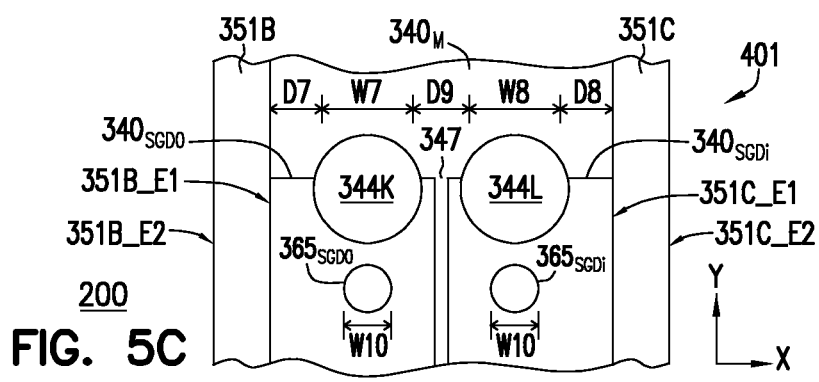

FIG. 5A, FIG. 5B, and FIG. 5C show top views of portions 5A, 5B, and 5C, respectively, of memory device 200 of FIG. 3, according to some embodiments described herein. As shown in FIG. 5A, FIG. 5B, and FIG. 5C, conductive contacts $365_{SGS}$, $365_0$, $365_1$, $365_M$, $365_{M-1}$, $365_{SGD0}$, and $365_{SGDi}$ can be located (e.g., can be formed) in groups at respective staircase structures 415, 402, and 401. For example, the group of conductive contacts $365_{SGS}$, $365_0$, and $365_1$ can be located at staircase structure 415 and can have a width (e.g., diameter) W3 in the X-direction. The group of conductive contacts $365_M$ and $365_{M-1}$ can be located at staircase structure 402 and can have a width (e.g., diameter) W6 in the X-direction. The group of conductive contacts $365_{SGD0}$ and $365_{SGDi}$ can be located at staircase structure 401 and can have a width (e.g., diameter) W10 in the X-direction.

Conductive contacts in different groups (located at different staircases) can have different widths (different dimensions (e.g., dimension in nanometers)). Thus, widths W3, W6, and W10 can be different from among each other. As an example, width W3 can be greater than width W6, and width W6 can be greater than width W10. Each of widths W3, W6, and W10 can be less than each of widths W1, W2, W4, W5, W7, and W8 of respective support structures 344A through 344L.

Conductive contacts in different groups (located at different staircases) can have different widths (different dimensions (e.g., dimension in nanometers)). Thus, widths W3, W6, and W10 can be different from among each other. As an example, width W3 can be greater than width W6, and width W6 can be greater than width W10. Each of widths W3, W7, and W10 can be less than each of widths W1, W2, W4, W5, W7, and W8 of respective support structures 344A through 344L.

As shown in FIG. 5A, FIG. 5B, and FIG. 5C, support structures 344A through 344L can be located (e.g., can be formed) in groups at respective staircase structures 415, 402, and 401. As shown in FIG. 5A, the group of support structures 344A through 344F can be located at staircase structure 415 and located adjacent respective conductive contacts $365_{SGS}$, $365_0$, and $365_1$. Support structures 344A through 344F can have respective widths (e.g., diameters) W1 and W2 in the X-direction. Widths W1 and W2 can be the same (e.g., having the same dimension in nanometers).

As shown in FIG. 5B, the group of support structures 344G through 344J can be located at staircase structure 402 and located adjacent respective conductive contacts $365_{M-1}$ and $365_M$. Support structures 344G through 344J can have respective widths (e.g., diameters) W4 and W5 in the X-direction. Widths W4 and W5 can be the same (e.g., having the same dimension in nanometers).

As shown in FIG. 5C, the group of support structures 344K and 344L can be located at staircase structure 401 and located adjacent respective conductive contacts $365_{SGD0}$ and $365_{SGDi}$. Support structures 344K and 344L can have respective widths (e.g., diameters) W7 and W8 in the X-direction. Widths W7 and W8 can be the same (e.g., having the same dimension in nanometers).

Support structures in different groups (located at different staircase structures) can have different widths (e.g., different dimensions in nanometers). For example, widths W1, W4, and W7 (or widths W2, W5, and W8) can be different from among each other. Width W1 can be less than width W4, and width W4 can be less than width W7. For example, width W1 can be 360 nm (nanometer) and can have a range from 345 nm to 375 nm. Thus, width W1 can be at least 345 nm and can have a dimension of up to 375 nm. In another example, width W4 can be 414 nm and can have a range from 399 nm to 429 nm. In another example, width W7 can be 420 nm and can have a range from 405 nm to 435 nm.

FIG. 5A, FIG. 5B, and FIG. 5C show distances D1 through D9. Each of distances D1 through D9 can be the shortest distance between edges of two adjacent elements (two adjacent structures) of memory device 200.

Distance D1 (FIG. 5A) can be measured between an edge (e.g., sidewall) 351B_E1 of dielectric structure 351B and an edge (not labeled) or a portion (not labeled) of support structure 344A that is closest to edge 351B_E1 (relative to other portions of support structure 344A). Similarly, each of support structures 344C and 344E can be located at distance D1 from edge 351B_E1. Dielectric structure 351B includes edges 351B_E1 and 351B_E2 opposite from each other in the X-direction. Edge 351B_E1 of dielectric structure 351B can be the portion at the location (e.g., an interface in the Y-direction) where conductive materials $340_{SGS}$, $340_0$, and $340_1$ contact (meet) the dielectric material of dielectric structure 351B. As shown in FIGS. 5A, 5B, and 5C, edge 351B_E1 of dielectric structure 351B can be located adjacent sidewalls (not labeled) of conductive materials $340_{SGS}$, $340_0$, $340_1$, $340_{M-1}$, and $340_M$ and conductive material $340_{SGD0}$ (where $340_0$, $340_1$, $340_{M-1}$, $340_M$ form respective control gates $250_0$ through $250_M$). Edge 351C_E1 of dielectric structure 351C can be located adjacent the other sidewalls (not labeled) of conductive materials $340_{SGS}$, $340_0$, $340_1$, $340_{M-1}$, and $340_M$ and sidewall of conductive material $340_{SGDi}$.

Distance D2 (FIG. 5A) can be measured between an edge (e.g., sidewall) 351C_E1 of dielectric structure 351C and an edge or a portion (not labeled) of support structure 344B that is closest to edge 351C_E1 (relative to other portions of support structure 344B). Similarly, each of support structures 344D and 344F can be located at distance D2 from edge 351C_E1. Dielectric structure 351B includes edges 351C_E2 and 351C_E1 opposite from each other in the X-direction. Edge 351B_C2 of dielectric structure 351C can be the portion at the location (e.g., an interface in the Y-direction) where conductive materials $340_{SGS}$, $340_0$, and $340_1$ contact (meet) the dielectric material of dielectric structure 351C.

Distance D3 (FIG. 5A) can be measured between adjacent edges (not labeled) of support structures 344A and 344B. Distance D3 can be closest distance (in the X-direction) between respective edges of support structures 344A and 344B. Similarly, support structures 344C and 344D can be separated from each other by distance D3. Support structures 344E and 344F are separated from each other by distance D3.

Distance D4 (FIG. 5B) can be measured between edge 351B_E1 of dielectric structure 351A and an edge or a portion (not labeled) of support structure 344G that is closest to edge 351B_E1 (relative to other portions of support structure 344G). Similarly, support structures 344I can be located at distance D4 from edge 351B_E1.

Distance D5 (FIG. 5B) can be measured between edge 351C_E1 of dielectric structure 351C and an edge or a portion (not labeled) of support structure 344H that is closest to edge 351C_E1 (relative to other portions of support structure 344H). Similarly, support structures 344J can be located at distance D5 from edge 351C_E1.

Distance D6 (FIG. 5B) can be measured between adjacent edges (not labeled) of support structures 344G and 344H. Distance D6 can be closest distance (in the X-direction) between support structures 344G and 344H. Similarly, support structures 344I and 344J are separated by distance D6.

Distance D7 (FIG. 5C) can be measured between edge 351B_E1 of dielectric structure 351A and an edge or a portion (not labeled) of support structure 344K that is closest to edge 351B_E1 (relative to other portions of support structure 344K).

Distance D8 (FIG. 5C) can be measured between edge 351C_E1 of dielectric structure 351C and an edge or a portion (not labeled) of support structure 344L that is closest to edge 351C_E1 (relative to other portions of support structure 344L).

Distance D9 (FIG. 5C) can be measured between adjacent edges (not labeled) of support structures 344K and 344L. Distance D9 can be closest distance (in the X-direction) between support structures 344K and 344L.

Distances D1, D4, and D7 (at staircase structures 415, 402, and 401, respectively) can be different among each other. Distance D7 can be less than distance D4, and distance D4 can be less than distance D1. For example, distance D1 can be 203 nm and can have a range from 190 nm to 215 nm. Thus, distance D1 can be less than 215 nm. In another example, distance D4 can be 176 nm and have a range from 163 nm to 189 nm. In another example, distance D7 can be 173 nm and can have a range from 160 nm to 186 nm.

The distances between elements at different staircase structures can be different from among each other. For example, distances D3, D6, and D9 (at staircase structures 415, 402, and 401, respectively) can be different among each other. Distance D9 can be less than distance D6, and distance D6 can be less than distance D3. As an example, distances D3, D6, and D9 can be 214 nm, 160 nm, and 154 nm, respectively. In another example, distance D3 can have a range from 202 nm to 227 nm. Thus, distance D3 can be less than 214 nm (and greater than or equal to 202 nm)

In FIG. 5A, FIG. 5B, and FIG. 5C, the ratio (e.g., dimension relationship) of a width of a particular support structure over a distance from an edge of that particular support structure to an edge of a respective dielectric structure expressed as W1/D1, W4/D4, and W7/D7. For example, based on the example dimension described above, the ratio W1/D1=1.77 (where W1=360 and D1=203). The ratio W1/D1 can have a range (e.g., an approximate range) from W1/D1=1.6 (where W1=345 and D1=215) to W1/D1=2.0 (where W1=375 and D1=190).

During the process of forming memory device 200 (described below with reference to FIG. 6A through FIG. 10C), collapse (e.g., due to stiction) of some structures of at particular locations of memory device 200 may occur. Such collapse can be prevented by structuring some elements (e.g., support structures 344A through 344L) of memory device 200 with specific dimensions (e.g., critical dimensions) such as specific dimensions (e.g., in nanometers) of widths W1 through W10, distances D1 through D9, and the ratios of the widths over the distances, as described above with reference to FIG. 5A, FIG. 5B, and FIG. 5C. Prevention of such collapse can lead to improved yield, reliability, or both of memory device 200.

Support structures 344A through 344L (described above with reference to FIG. 3 through FIG. 5C0 can be formed using processes described below with reference to FIG. 6A through FIG. 10C. Part of forming support structures 344A through 344L can include using a reticle (e.g., a mask) during the processes described below with reference to FIG. 6A through FIG. 10C. Such a reticle can include reticle 1100 described below with reference to FIG. 11.

Figure 6A:
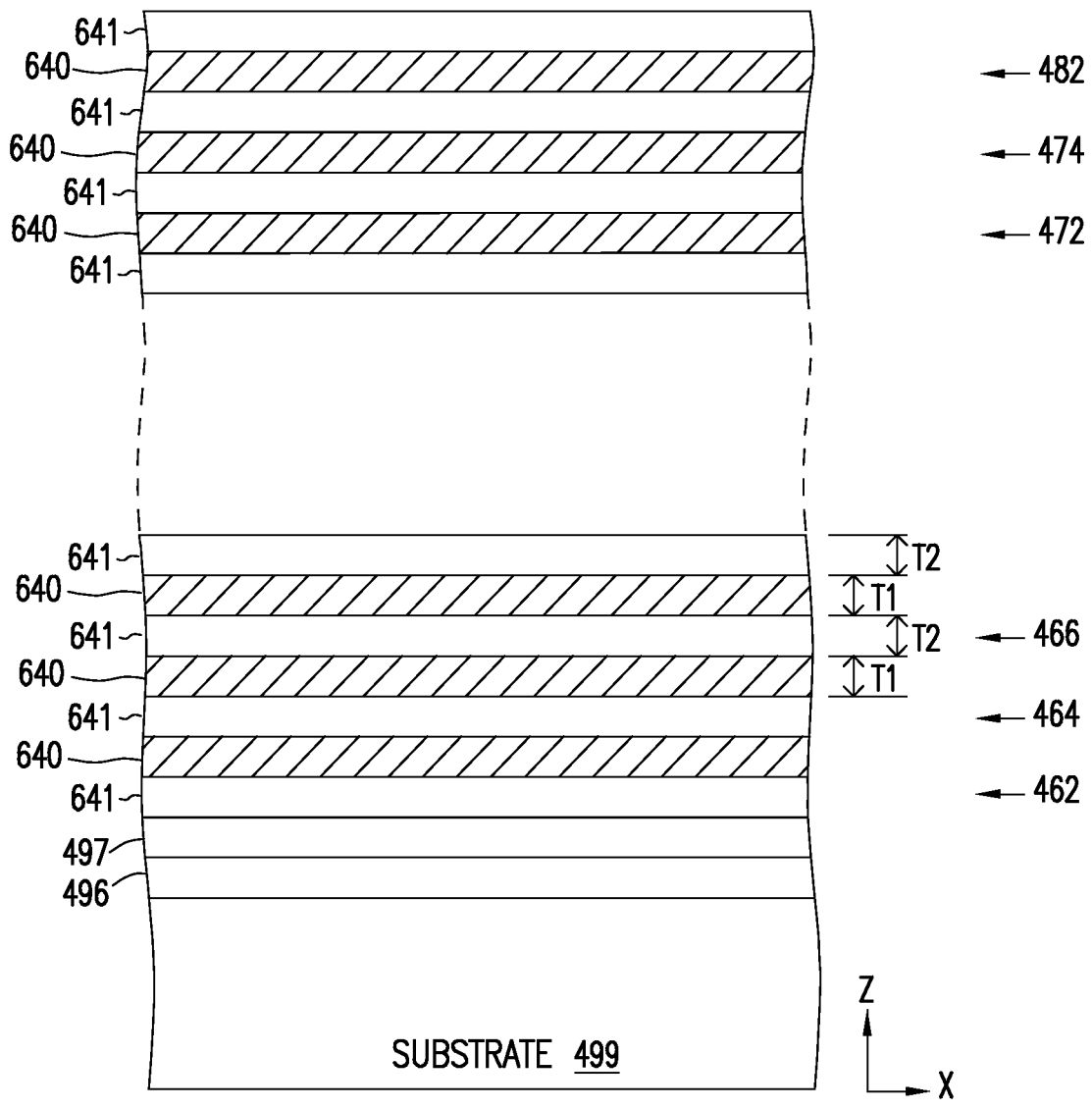
FIG. 6A through FIG. 10C are representative diagrams showing different views of structures during processes of forming the memory device of FIG. 2 through FIG. 5C, according to some embodiments described herein.

FIG. 6A through FIG. 10C show different views of structures during processes of forming memory device 200 of FIG. 2 through FIG. 5C, according to some embodiments described herein. FIG. 6A shows a side view (e.g., a cross-sectional view) in the X-direction of device 200 after dielectric materials (levels of dielectric materials) 640 and dielectric materials (levels of dielectric materials) 641 are alternatively formed over substrate 499 (e.g., formed sequentially one material after another over substrate 499 in an interleaved fashion).

As shown in FIG. 6A, a level (e.g., a single layer) of conductive materials 340 can have a thickness T1. A level (e.g., a single layer) of dielectric materials 641 can thickness T2. Thickness T1 can be 32 nm and can have a range from 30 nm to 35 nm. Thickness T2 can be 25 nm and can have a range from 22 nm to 27 nm.

Dielectric materials 640 can include silicon nitride. Dielectric materials 641 can include silicon dioxide. As shown in FIG. 6A, dielectric materials 640 and 641 can be formed, such that dielectric materials 640 can interleave with dielectric materials 641 in the Z-direction on respectively levels 462, 464, 466, 472, 474, and 482. For simplicity, FIG. 6A omits some of dielectric materials 640 and 641 between levels 466 and 472.

Figure 6B:
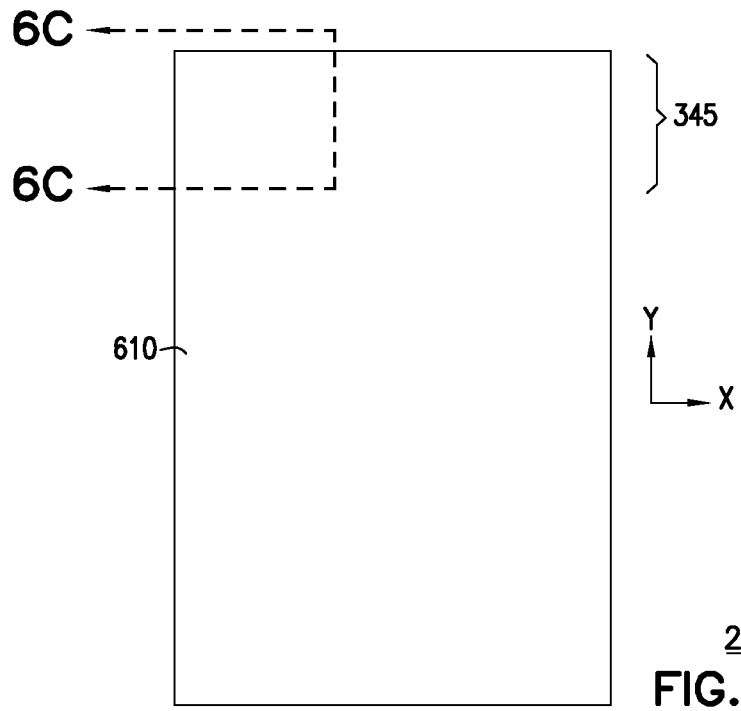

FIG. 6B shows a top view (e.g., X-Y plan) of memory device 200 of FIG. 6A. FIG. 6B also shows the location of staircase region 345 where staircase structures 401, 402, and 415 (FIG. 4A) can be formed in subsequent processes (e.g., the processes associated with FIG. 7) in respective locations of staircase region 345. In FIG. 6B, line 6C-6C shows a location of a portion (e.g., a cross-section) of memory device 200 shown in FIG. 6C.

Figure 6C:
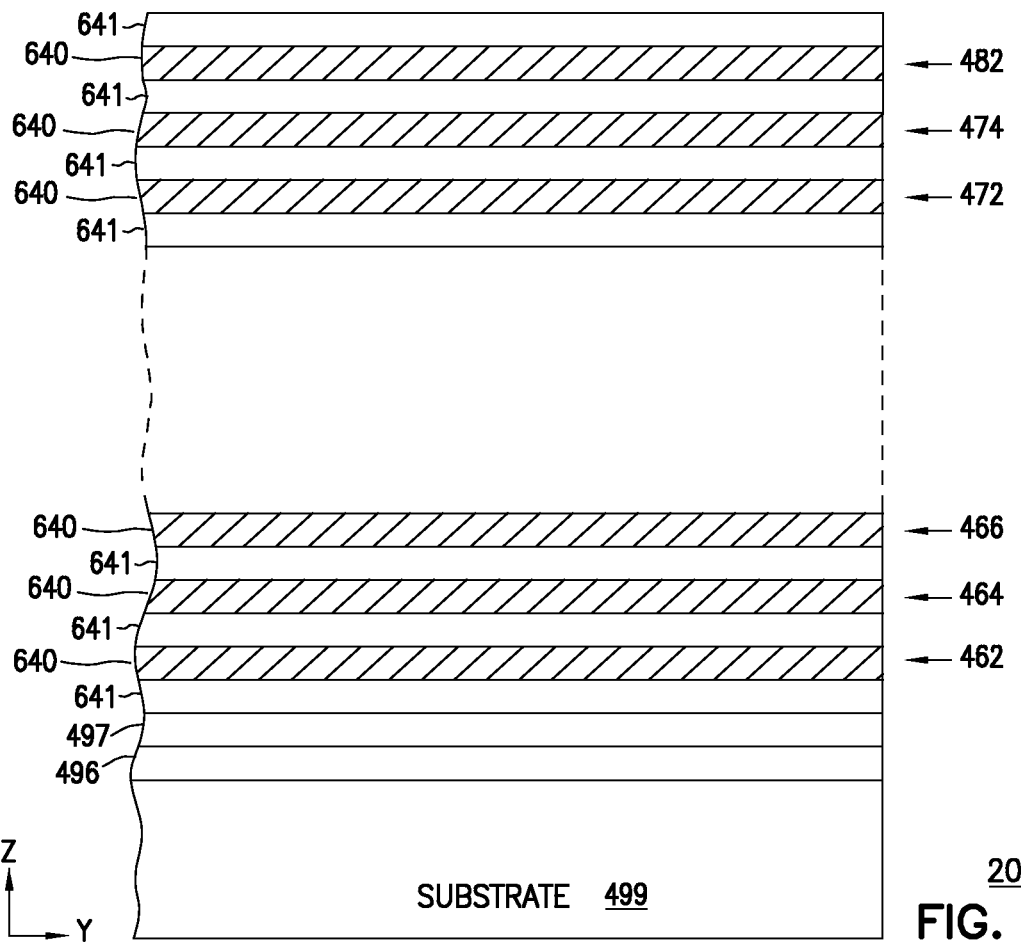

As shown in FIG. 6C, the interleaved formation of dielectric materials 640 and 641 shown in the Y-Z direction can be the same as the interleaved formation of dielectric materials 640 and 641 shown in the X-Z direction (shown in FIG. 6A).

Figure 7:
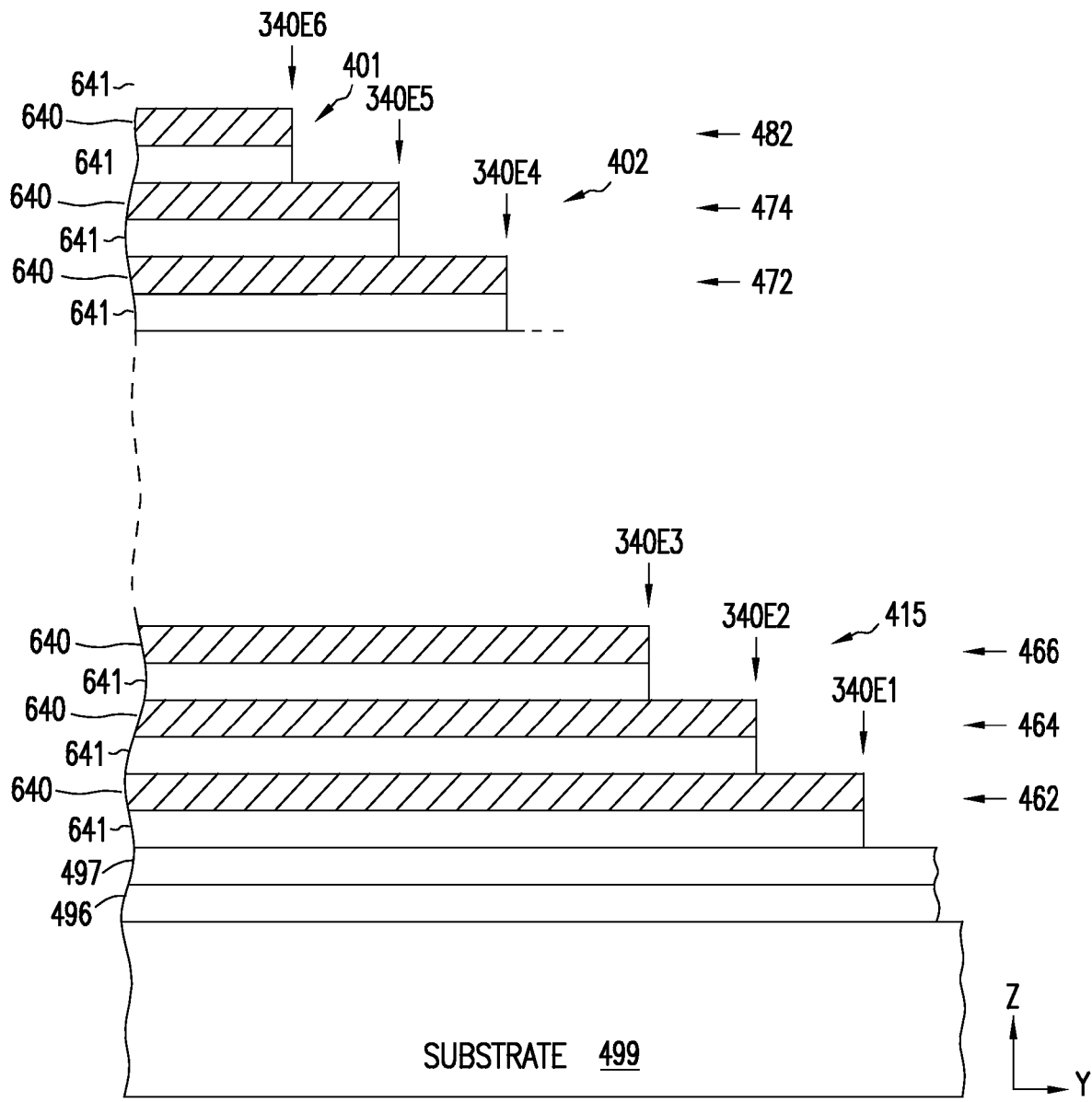

FIG. 7 shows memory device 200 of FIG. 6C (in the Y-Z direction) after staircase structures 401, 402, and 415 are formed. Forming staircase structures 401, 402, and 415 can include removing a portion of dielectric materials 640 and 641 to obtain a remaining portion of dielectric materials 640 and 641 having respective edges (e.g., vertical edges) at locations 340E1 through 340E6, at respective levels among levels 462, 464, 466, 472, and 482.

Figure 8A:
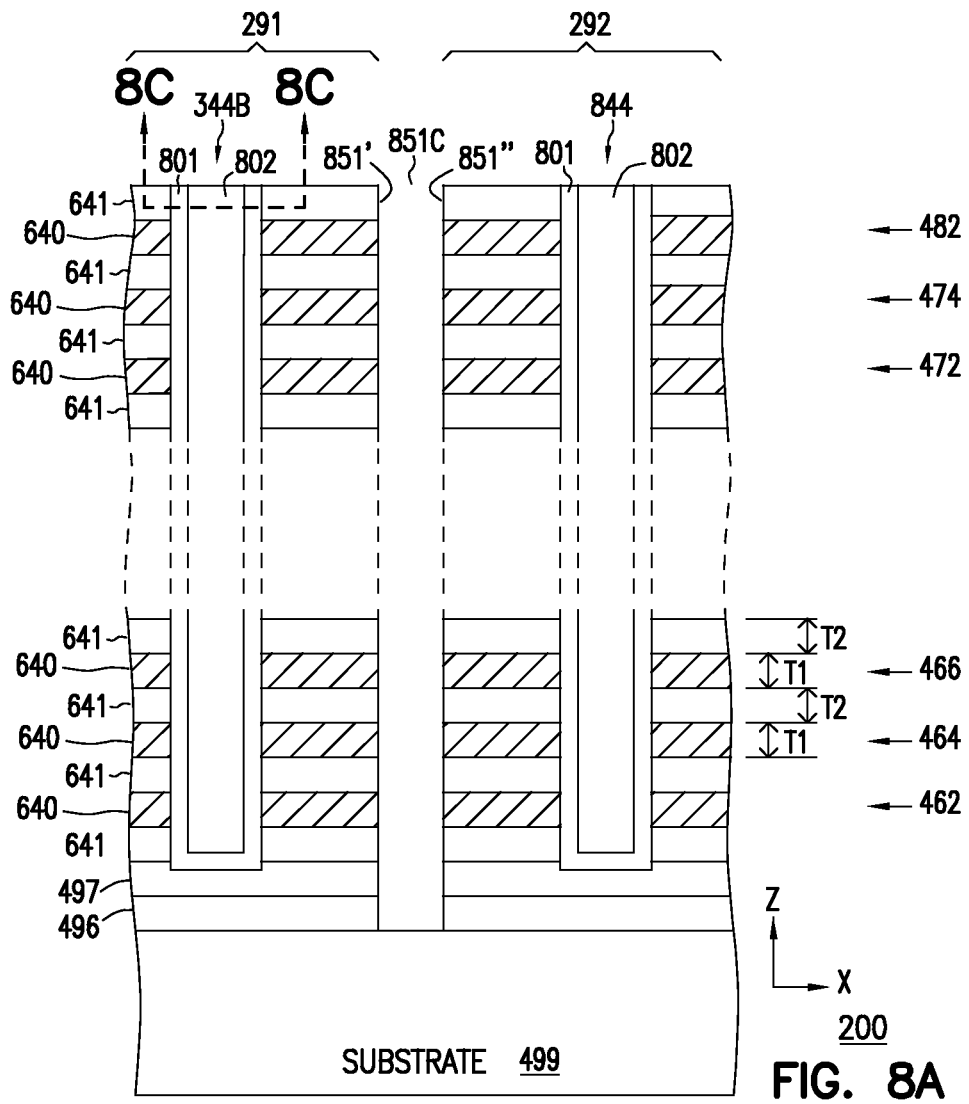

FIG. 8A shows a side view (in the X-Z direction, like the side view of FIG. 6A) of memory device 200 after formation a support structure 844 (of block 292) and a support structure 344B (of block 291), and a slit (e.g., a trench) 851C.

Forming support structures 344B and 844 can include removing portions of dielectric materials 640 and 641 to form openings (e.g., holes) at the locations where support structures 344B and 844 would be formed, and then forming materials 801 and 802 in the openings. Material 801 can include a combination (e.g., different layers) of materials. Line 8C-8C shows a portion (e.g., cross-section) of support structure 344B that is shown in detail in FIG. 8C.

Forming slit 851C (FIG. 8A) can include removing a portion of dielectric materials 640 and 641 to form an opening at the location of slit 851C, such that slit 851C can include edges (e.g., sidewalls) 851' and 851". Edges 851' and 851" can correspond to edges 351C_E1 and 351C_E2, respectively of FIG. 5. As shown in FIG. 8A, each of edges 851' and 851" can include (e.g., can be formed by) respective sidewalls (not labeled) of dielectric materials 640 and 641 at the location of slit 851C. Slit 851C can be formed after support structures 344B and 844 are formed.

For simplicity, only two support structures 344B and 844 are shown in FIG. 8A. Other support structures (e.g., support structures 344A and 344C through 344L) can be formed in similar fashions as support structures 344B and 844 and can be formed concurrently (e.g., formed in the same process step) with support structures 344B and 844.

Figure 8B:
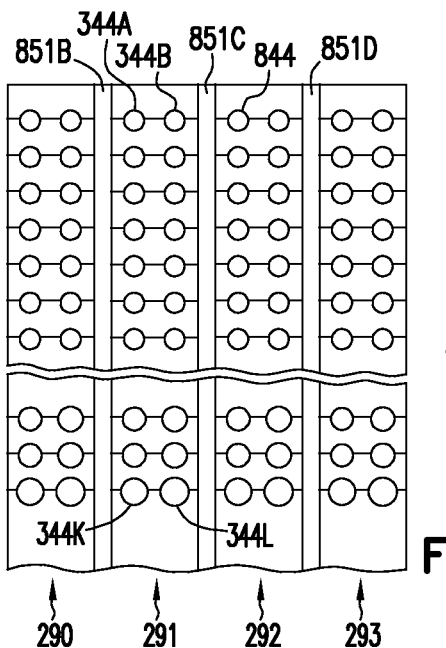

FIG. 8B shows memory device 200 after formation of support structures (only support structures 334A, 344B, 344K, 344L, and 844 are labeled) and slits 851B, 851C, and 851D between respective blocks 290, 291, 292, and 293 of memory device 200. Slits 851B, 851C, and 851D can correspond to respective slits of dielectric structures 351B, 351C, and 351D, respectively, of FIG. 3. A reticle (e.g., reticle 1100 of FIG. 11) can be used in the process of forming support structures 344A through 344L (and other support structures) of block 291. Other reticles (similar to reticle 1100) can be used in the process of forming support structures in other blocks (e.g., blocks 290, 292, and 293) of memory devices. Support structures of blocks 290, 291, 292, and 293 can be concurrently formed (e.g., formed using the same process step at the same time).

Figure 8C:
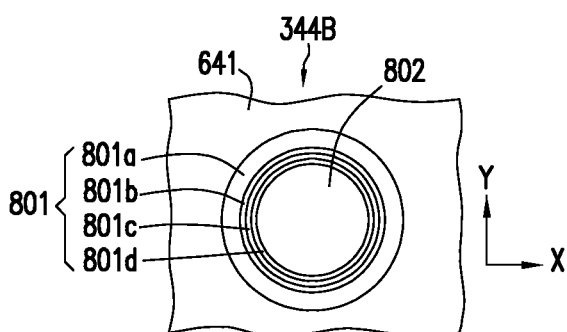

As shown in FIG. 8C, material 801 of support structures 344B can include a combination of materials 801a, 810b, 801c, and 801d that can be formed one material (e.g., one layer) after another. For example, material 801a can be formed first, material 801b can be formed after material 801a is formed, material 801c can be formed after material 801b is formed, and material 801d can be formed after material 801c is formed. Material 802 can be formed after material 801 (e.g., after material 802d) is formed. Materials 801a, 810b, 801c, and 801d can include silicon dioxide, silicon nitride, titanium, and titanium nitride, respectively. Material 802 can include metal (e.g., tungsten or other metal).

Support structures (support structures 344B and 844 in FIG. 8A, and other support structures not shown) of memory device 200 can be concurrently formed (e.g., formed in the same process step). However, as described above with reference to FIG. 5A, FIG. 5B, and FIG. 5C, support structures at different staircase structures (e.g., staircase structures 401, 402, and 415) can have different widths (e.g., different diameters). Support structures (support structures 344B and 844 in FIG. 8A, and other support structures not shown) of memory device 200 can be formed to provide structural support to portion (e.g., staircase region 345) of memory device 200 during particular processes of forming memory device 200. For example, support structures (support structures 344B and 844 in FIG. 8AA, and other support structures not shown) of memory device 200 can provide structural support to memory device 200 when dielectric materials 640 is removed during the process of forming memory device 200 associated with FIG. 9A.

Figure 9A:
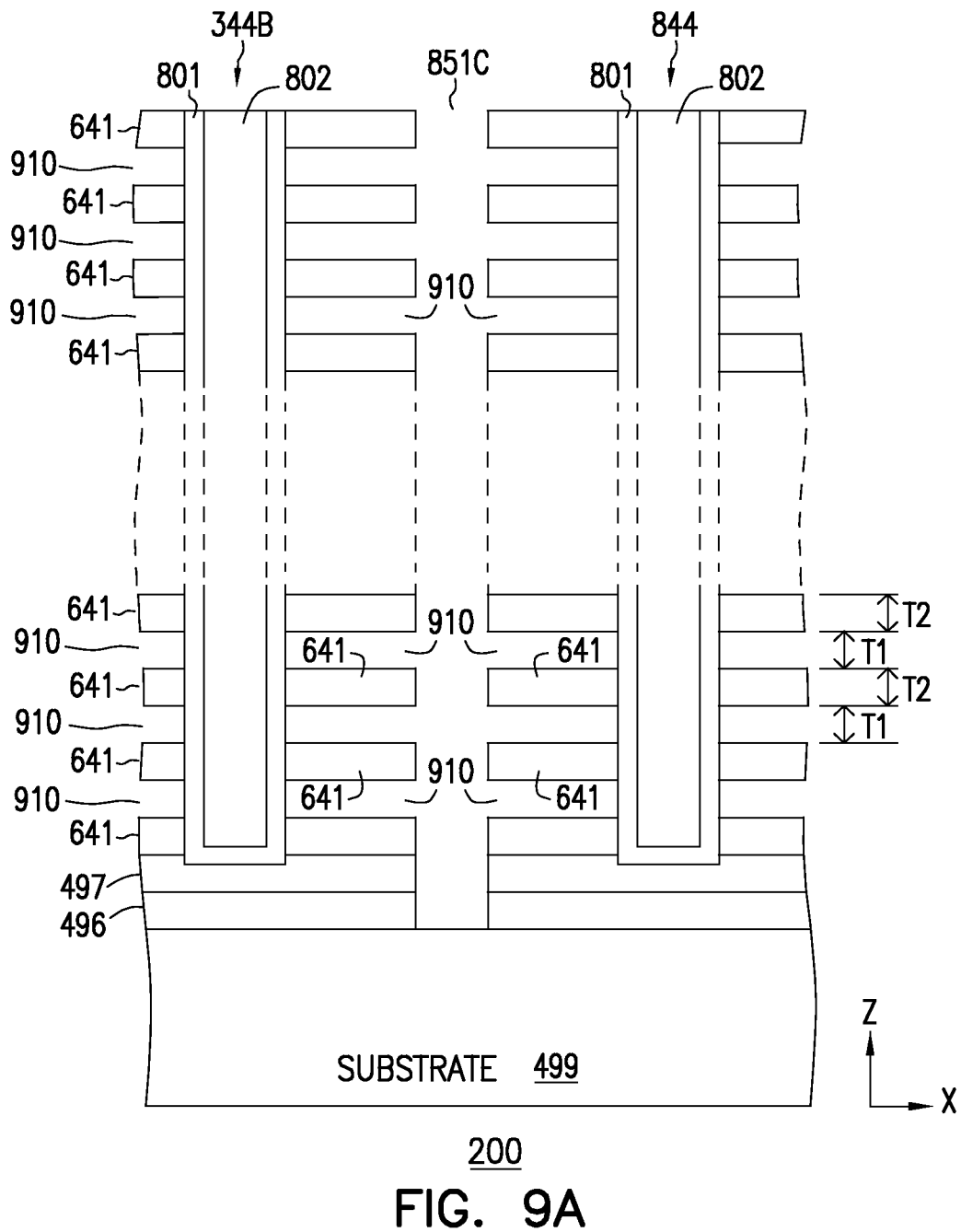

FIG. 9A shows memory device 200 after dielectric materials 640 (FIG. 8A) is removed (e.g., exhumed) from locations 910 (FIG. 9A). Support structures 344B and 844 can provide structural support to prevent the higher levels of dielectric materials 641 from falling down to lower levels of dielectric materials 641 during the process of forming memory device 200 (e.g., during the process associated with the removal of materials 640 in FIG. 9A).

Figure 9B:
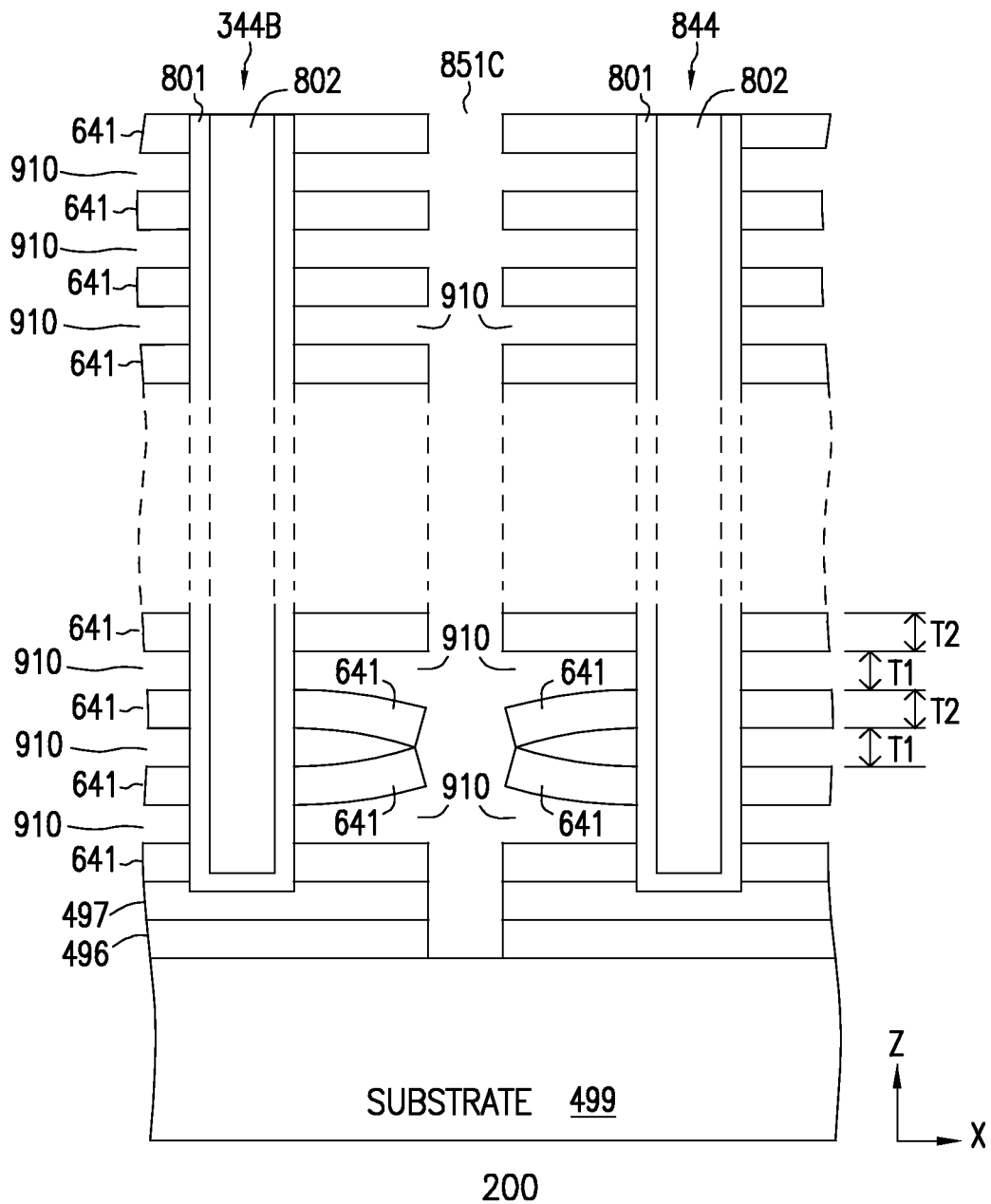

FIG. 9B shows memory device 200 in an example situation that includes a collapse of portions of dielectric materials 641 the location of slit 851C. As shown in FIG. 9B adjacent portions of dielectric materials 641 can collapse, such that the adjacent portions of dielectric materials 641 can touch (contact) each other.

At a certain values of thicknesses T1 and T2, collapse of dielectric materials 641 at some locations (e.g., at staircase structure 415) of memory device 200 may occur (e.g., due to stiction). Such stiction may be caused by adjacent dielectric materials 641 stick to each other (e.g., upon experiencing capillary force caused by surface tension) causing the collapse of some of dielectric materials 641 like the example situation shown in FIG. 9B. The collapse can cause conductive materials (e.g., conductive materials $340_{SGS}$, $340_0$, and $340_1$) formed in subsequent processes at the locations of collapse to short (e.g., electrically coupled to) each other. Such a short can degrade or destroy the function of memory device 200. To prevent such collapse and improve the structure and reliability of memory device 200, some of the elements of memory device 200 can be formed with specific dimensions (e.g., critical dimensions in nanometers). For example, as described above with reference to FIG. 5A, FIG. 5B, and FIG. 5C, the widths (e.g., widths W1 through W10), distances (e.g., distances D1 through D9), and width over distance ratios of memory device 200 can be formed with specific dimension (e.g., critical dimension in nanometers) to prevent collapse in dielectric materials 641 at locations (e.g., at staircase structure 415) that are prone to such collapse. An example, dielectric materials 641 without such collapse is shown in FIG. 9A.

Figures 10A, 10B:
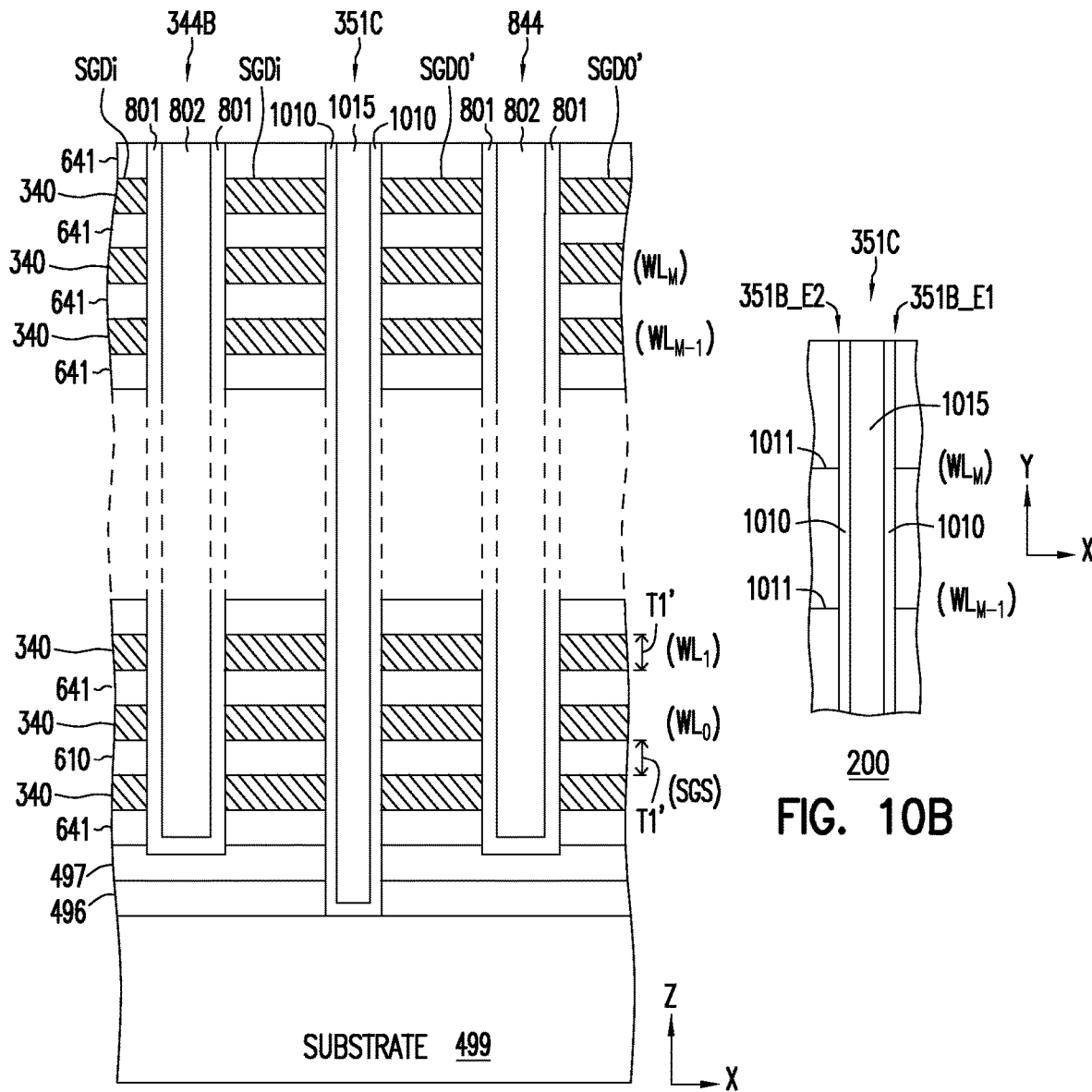

FIG. 10A shows memory device 200 of FIG. 9A after formation of conductive materials (e.g., levels of conductive materials) 340 and dielectric structure 351C. As shown in FIG. 10A, a level (e.g., a single layer) of conductive materials 340 can have thickness T1'. Thickness T1' can be the same thickness T1 of a level of dielectric materials 640 (FIG. 8A). For example, thickness T1' can be 32 nm and can have a range from 30 nm to 35 nm.

Conductive materials 340 can be formed by filling a material (or materials) in location 910 (FIG. 9A). In an example, conductive materials 340 can include a single conductive material, for example, a single metal (e.g., tungsten). In another example, conductive materials 340 can include multiple materials (which can be formed one material after another). One of the multiple materials can include a conductive material (e.g., metal such as tungsten). For example, conductive materials 340 can include different layers of aluminum oxide (AlO), titanium nitride (TNi), and tungsten (W). Conductive materials 340 can correspond to conductive materials $340_{SGS}$, $340_0$, $340_1$, $340_{M-1}$, $340_M$, $340_{SGD0}$, and $340_{SGDi}$ shown in FIG. 4A. Signals SGS, $WL_0$, $WL_1$, $WL_{M-1}$, $WL_M$, $SGD_0$, and $SGD_i$ associated with respective conductive materials 340 in FIG. 10A are the same as the signals shown in FIG. 4A. Dielectric materials 641 can correspond to dielectric materials 341 of FIG. 4A.

In the processes associated with FIG. 10A, dielectric structure 351C can be formed by filling (e.g., depositing) materials 1010 and 1015 in the location of slit 815B (FIG. 9A). Material 1010 can include a dielectric material (e.g., silicon dioxide). Material 1015 can include polysilicon, or alternatively, a dielectric material (e.g., silicon dioxide or silicon nitride). As shown in FIG. 10A, material 1010 can be formed (e.g., located) adjacent sidewalls (e.g., vertical sidewalls) of respective materials 340 and 641 at the location of dielectric structure 351C.

FIG. 10B shows a top view (in the X-Y direction) of a portion of memory device 200 of FIG. 10A at dielectric structure 351C. As shown in FIG. 10A and FIG. 10B, material 1010 and be formed on both sides (e.g., formed on opposite sidewalls in the X-direction, not labeled) of dielectric structure 351C. Material 1015 can be formed between portions (e.g., sidewall portions) of material 1010. Materials 1010 and 1015 can be formed along the length (in the Y-direction) of dielectric structure 351C.

Figure 10C:
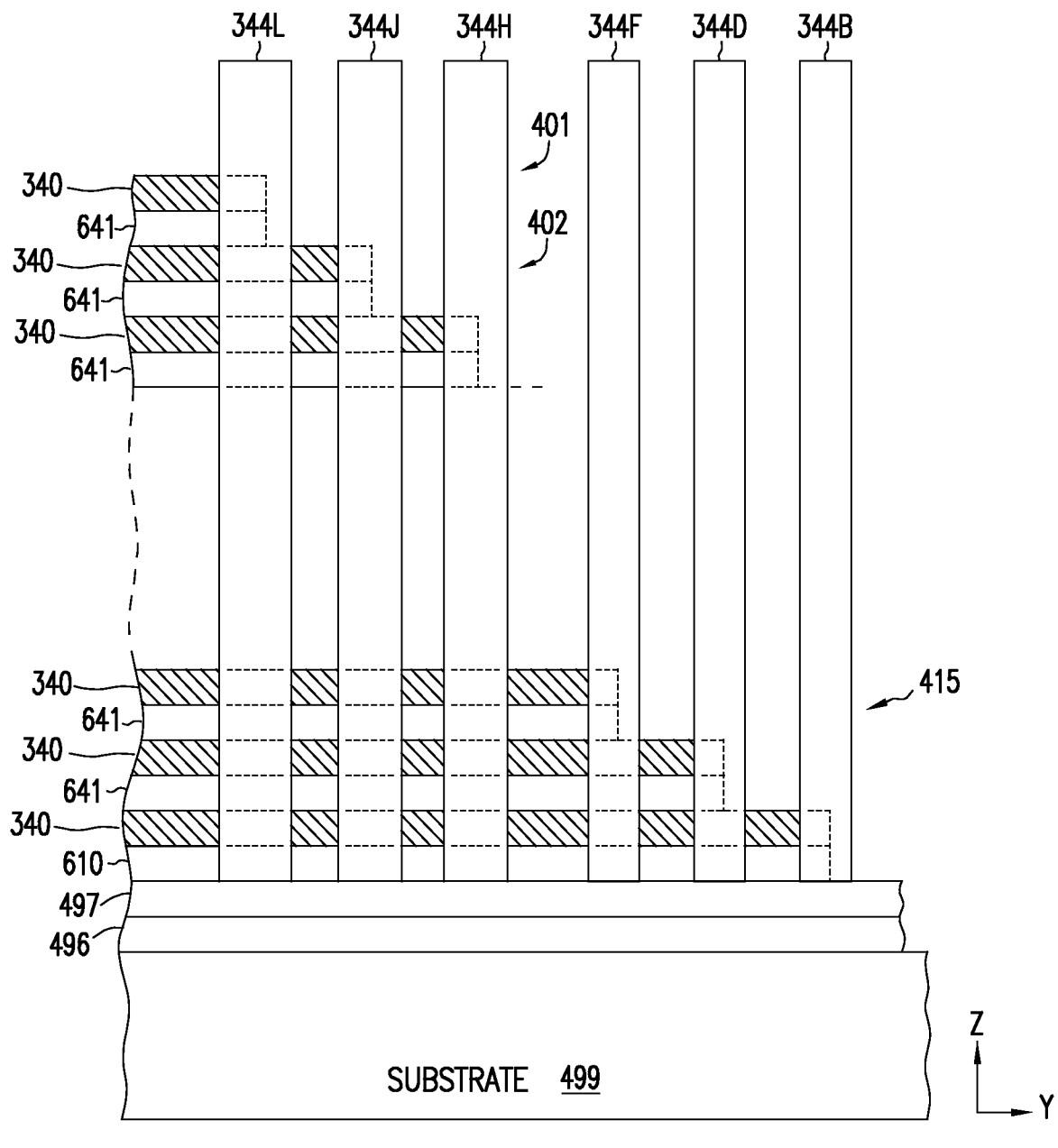

FIG. 10C shows a side view (e.g., cross-section) of memory device 200 of FIG. 10A including support structures 344B, 344D, 344F, 344H, 344J, and 344L (formed in the processes associated with FIG. 8A). Other support structures (e.g., support structures 344B, 344D, 344F, 344G, 344I, and 344K, formed in the processes associated with FIG. 8A) are hidden from the views of FIG. 10C. After support structures (e.g., support structures 344E through 344L) of memory device 200 are formed, conductive contacts $365_{SGS}$, $365_1$, $365_M$, $365_{M-1}$, $365_{SGD0}$, and $365_{SGDi}$ (FIG. 5A, FIG. 5B, and FIG. 5C) can be formed in subsequent processes of memory device 200. For simplicity and to not obscure the embodiments described herein, subsequent processes to complete memory device 200 are not described herein.

Figure 11:
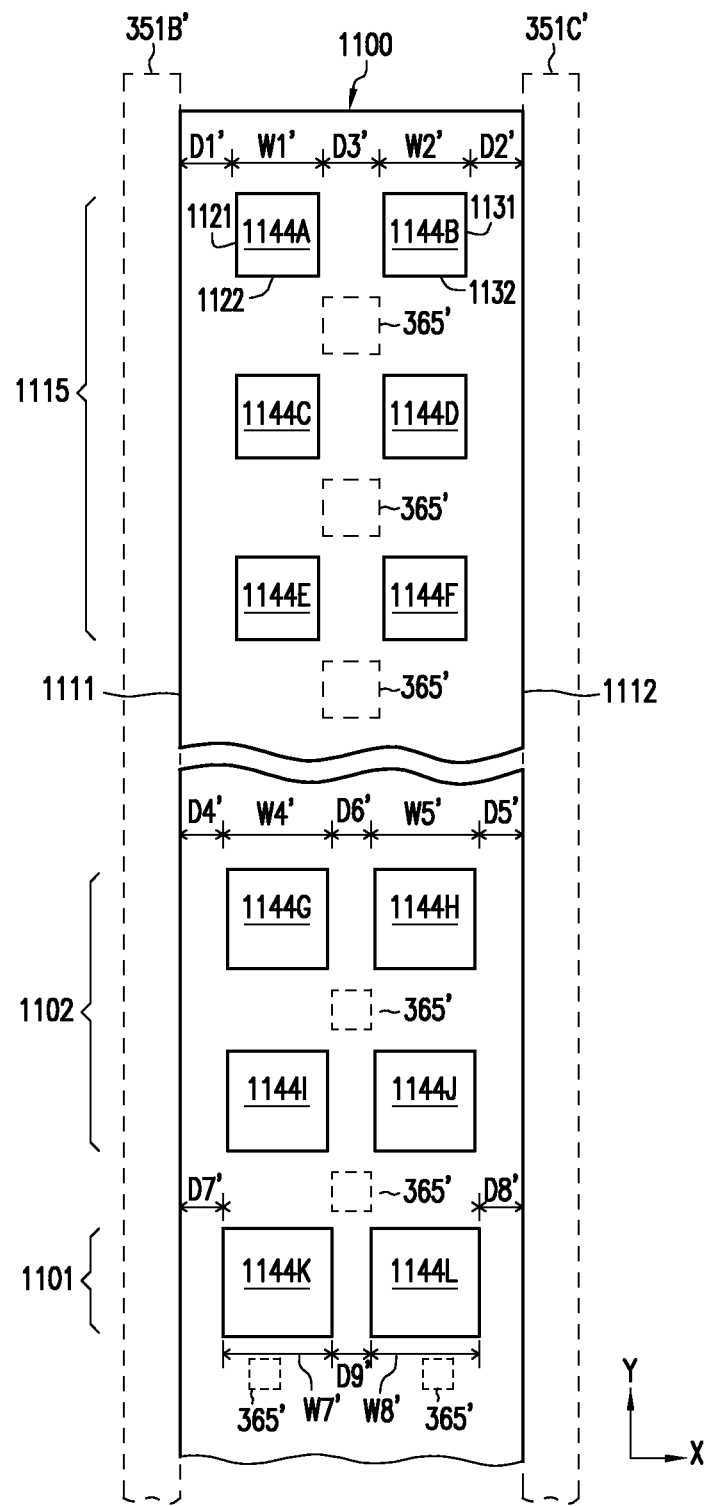
FIG. 11 shows a reticle configured to be included in a system for forming part of the memory device of FIG. 6A through FIG. 10C, according to some embodiments described herein.

FIG. 11 shows a reticle (e.g., mask) 1100, according to some embodiments described herein. Reticle 1100 can be configured to be used in part of the process of forming memory device 200 of FIG. 2 through FIG. 10C. For example, reticle 1100 can be configured to be included in a system (e.g., system 1200 of FIG. 12) during the process of forming support structures (e.g., support structures 344A through 344L) of block 291 (FIG. 8B) of memory device 200.

As shown in FIG. 11, reticle 1100 can include edges (e.g., sides) 1111 and 1112 extending in the Y-direction, and patterns (e.g., square features) 1144A through 1144L between edges 1111 and 1112. Pattern 1144A can include sides 1121 and 1122. Sides 1121 and 1122 can have the same dimension (e.g., dimension in nm). As shown in FIG. 11, pattern 1144A can be located next to edge 1111. Side 1121 can be parallel to edge 1111. Side 1122 is connected to side 1121 at an angle (e.g., 90-degree angle) and can be perpendicular to edge 1111.

Pattern 1144B can include sides 1131 and 1132. Sides 1131 and 1132 can have the same dimension (e.g., dimension in nm). As shown in FIG. 11, pattern 1144B can be located next to edge 1112. Side 1131 can be parallel to edge 1112. Side 1132 is connected to side 1131 at an angle (e.g., 90-degree angle) and can be perpendicular to edge 1112.

Other patterns (e.g., patterns 1144C through 1144L) of reticle 1100 can also include sides similar to that of patterns 1144A and 1144B. Patterns at respective portions 1101, 1102, and 1115 of reticle 1100 can be used during the process of forming support structures (e.g., support structures 344A through 344L) at the locations of staircase structures 401, 402, and 415, respectively, of memory device 200 (FIG. 5A, FIG. 5B, and FIG. 5C).

FIG. 11 also shows (in dashed lines) locations of some structures of memory device 200 relative to the patterns (e.g., patterns 1144A through 1144L). For example, locations 351B' and 351C' can correspond to locations of dielectric structures 351B and 351C, respectively (FIG. 5A, FIG. 5B, and FIG. 5C). Locations 365' can correspond to locations of respective conductive contacts $365_{SGS}$, $365_0$, $365_1$, $365_M$, $365_{M-1}$, $365_{SGDi}$, and $365_{SGD0}$ (FIG. 5A, FIG. 5B, and FIG. 5C).

As shown in FIG. 11, patterns 1144A through 1144L can include respective widths W1', W2', W4', W5', W7', and W8'. The distances between patterns 1144A through 1144L, between patterns 1144A through 1144L and respective edges 1111 and 1112 are indicated by distances D1' through D9'.

Patterns 1144A through 1144L can be used in the process of forming support structures 344A through 344L, respectively, of memory device 200 (FIG. 5A, FIG. 5B, and FIG. 5C). Thus, the dimensions (in nm) of widths W1, W2, W4, W5, W7, and W8 (FIG. 5A, FIG. 5B, and FIG. 5C) can be based on the dimensions (in nm) of widths W1', W2', W4', W5', W7', and W8', respectively, of reticle 1100 (FIG. 11). For example, the dimensions of widths W1', W2', W4', W5', W7', and W8' (FIG. 11) can be determined (e.g., selected) to be the same (or substantially the same) as the dimensions of width W1, W2, W4, W5, W7, and W8, respectively, (FIG. 5A, FIG. 5B, and FIG. 5C).

The dimensions (in nm) of distances D1 through D9 (FIG. 5A, FIG. 5B, and FIG. 5C) can be based on the dimensions of distances D1' through D9', respectively. For example, the dimensions (in nm) of widths W1', W2', W4', W5', W7', and W8' can be determined (e.g., selected) to be the same (or substantially the same) as the dimensions of widths W1, W2, W4, W5, W7, and W8, respectively, of FIG. 5A, FIG. 5B, and FIG. 5C.

In reticle 1100, the ratios (e.g., W1'/D1', W4'/D4', and W7'/D7') of widths W1', W4', and W7' over distances D1', D4', and D7' can be the same as the ratios (e.g., W1/D1, W4/D4, and W7/D7) of widths W1, W4, and W7 over distances D1, D4, and D7.

Using reticle 1100 in the process of forming support structures (e.g., support structures 344A through 344L) of memory device 200 can allow the support structures of memory device 200 to have specific dimensions (in nm) as described above with reference to FIG. 5A, FIG. 5B, and FIG. 5C. Benefits and improvements of support structures (e.g., support structures 344A through 344L) of memory device 200 with such specific dimensions (in nm) are described above with reference to FIG. 3 through FIG. 10C.

Figure 12:
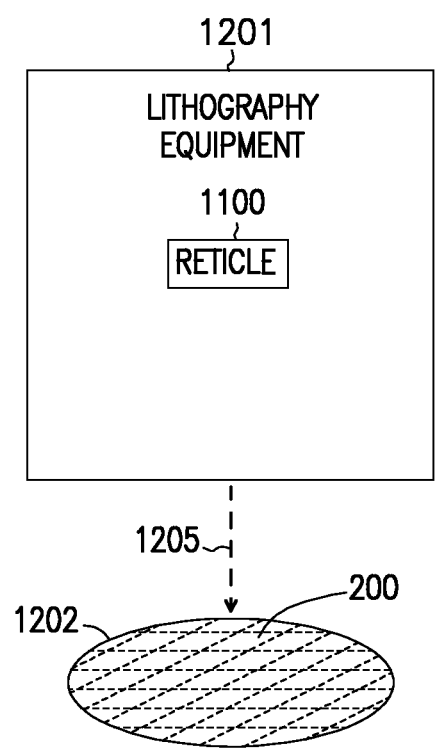
FIG. 12 shows a system including lithograph equipment that includes the reticle of FIG. 11, according to some embodiments described herein.

FIG. 12 show a system 1200 including lithography equipment (e.g., a stepper) 1201 and reticle 1100, according to some embodiments described herein. System 1200 can be used in part of the process of forming memory device 200. For example, lithography equipment 1201 that can be used to pass a light source (not shown) through reticle 1100. Then, projection lens (not shown) of lithography equipment 1201 can receive the light source (after the light source passes through reticle 1100) and produce a light beam 1205 based on the light source. The projection lens can project light beam 1205 onto a wafer 1202 during formation of support structures 344A through 344L (show in details in FIG. 5A, FIG. 5B, and FIG. 5C) of memory device 200, which can be a portion of a wafer 1202. The dimensions (in nm) of support structures 344A through 344L can be based on the dimensions of patterns (e.g., patterns 1144A through 1144L) of reticle 1100. Benefits and improvements support structures 344A through 344L (e.g., formed by using reticle 1100 in system 1200) are described above with reference to FIG. 3 through FIG. 11.

The embodiments described above with reference to FIG. 1 through FIG. 12 include apparatuses and methods of forming the apparatuses. One of the apparatuses includes a substrate a substrate; tiers located one over another over the substrate, the tiers including respective memory cells and control gates for the memory cells, the control gates including a control gate closest to the substrate than other control gates, the control gates including respective portions that collectively form a staircase structure; conductive contacts contacting the control gates at a location of the staircase structure, the conductive contacts having different lengths extending vertically from the substrate, the conductive contacts including a conductive contact contacting the first control gate; a dielectric structure adjacent sidewalls of the control gates of the tiers; and support structures adjacent the conductive contacts and electrically separated from the control gates and the conductive contacts, the support structures having lengths extending vertically from the substrate and extending through at least a portion of the control gates, the support structures including a support structure closest to the conductive contact than other support structures, the support structure located at a distance from an edge of the dielectric structure, wherein a ratio of a width of the support structure over the distance is ranging from 1.6 to 2.0. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A reticle comprising:
   a first edge and a second edge opposite from the first edge;
   a first pattern next to the first edge, the first pattern including a first side parallel to the first edge, and a second side connected to the first side and perpendicular to the first edge, the second side having a dimension ranging from 345 nanometers to 375 nanometers; and
   a second pattern next to the second edge, the second pattern including a first side parallel to the second edge, and a second side connected to the first side of the second pattern and perpendicular to the second edge, the second side of the second pattern having a dimension ranging from 345 nanometers to 375 nanometers, wherein the reticle is configured to be included in a system for forming support structures of a memory device such that the support structures have dimensions based on the dimensions the first and second patterns, the support structures located at a staircase structure over a substrate of the memory device, the memory device including additional staircase structures located over the substrate, and wherein the staircase structure is located closest to the substrate relative to locations of the additional staircase structures.

2. The reticle of claim 1, wherein a distance between the first edge and the first side of the first pattern is less than 215 nanometers.

3. The reticle of claim 1, wherein a distance between the second edge and the first side of the second pattern is less than 215 nanometers.

4. The reticle of claim 1, wherein a distance between the first side of the first pattern and the first side of the second pattern is ranging from 202 nanometers to 227 nanometers.

5. A reticle comprising:
   an edge;
   a first pattern next to the edge, the first pattern including a first side parallel to the edge and at a first distance from the edge, and a second side connected to the first side and perpendicular to the edge, the second side having a first dimension; and
   a second pattern next to the edge, the second pattern including a first side parallel to the edge and at a second distance from the edge, the second distance being different from the first distance, and a second side connected to the first side of the second pattern and perpendicular to the edge, the second side of the second pattern having a second dimension, wherein the first dimension is less than the second dimension, a first ratio between the first dimension and the first distance is less than a second ratio between the second dimension and the second distance, and wherein the reticle is configured to be included in a system for forming support structures of a memory device such that the support structures have dimensions based on the dimensions the first and second patterns, the support structures located at a staircase structure located over a substrate of the memory device.

6. The apparatus of claim 5, wherein the first dimension is ranging from 345 nanometers to 375 nanometers.

7. The apparatus of claim 5, wherein the second dimension is ranging from 399 nanometers to 429 nanometers.

8. The apparatus of claim 5, wherein the first dimension is ranging from 345 nanometers to 375 nanometers, and the second dimension is ranging from 399 nanometers to 429 nanometers.

9. The apparatus of claim 5, wherein the first dimension is ranging from 399 nanometers to 429 nanometers.

10. The apparatus of claim 5, wherein the second dimension is ranging from 405 nanometers to 435 nanometers.

11. The apparatus of claim 5, wherein the first dimension is ranging from 399 nanometers to 429 nanometers, and the second dimension is ranging from 405 nanometers to 435 nanometers.

12. The apparatus of claim 5, wherein the first dimension is ranging from 345 nanometers to 375 nanometers, and the second dimension is ranging from 405 nanometers to 435 nanometers.

13. A reticle comprising:
    an edge;
    a first pattern next to the edge, the first pattern including a first side parallel to the edge and located at a first distance from the edge, and a second side connected to the first side and perpendicular to the edge, the second side having a first dimension; and
    a second pattern next to the edge, the second pattern including a first side parallel to the edge and located at a second distance from the edge, and a second side connected to the first side of the second pattern and perpendicular to the edge, the second side of the second pattern having a second dimension, wherein a first ratio between the first dimension and the first distance is less than a second ratio between the second dimension and the second distance, wherein the reticle is configured to be included in a system for forming support structures of a memory device such that the support structures have dimensions based on the dimensions the first and second patterns, the support structures located at a staircase structure located over a substrate of the memory device.

14. The apparatus of claim 13, wherein the first ratio is ranging from 1.6 to 2.0.

15. The apparatus of claim 13, wherein the first dimension is ranging from 345 nanometers to 375 nanometers.

16. The apparatus of claim 13, wherein the first distance has a range from 190 nanometers to 203 nanometers.

17. The apparatus of claim 13, wherein the second distance has a range from 163 nanometers to 189 nanometers.

18. The apparatus of claim 13, wherein the second distance has a range from 160 nanometers to 186 nanometers.

19. The apparatus of claim 13, wherein the first distance has a range from 190 nanometers to 203 nanometers, and the second distance has a range from 163 nanometers to 189 nanometers.

20. The apparatus of claim 13, wherein the first distance has a range from 190 nanometers to 203 nanometers, and the second distance has a range from 160 nanometers to 186 nanometers.

* * * * *